US011605677B2

(12) United States Patent
Lee et al.

(10) Patent No.: US 11,605,677 B2
(45) Date of Patent: *Mar. 14, 2023

(54) DISPLAY DEVICE

(71) Applicant: Samsung Display Co., Ltd., Yongin-si (KR)

(72) Inventors: Young Hee Lee, Suwon-si (KR); Hyun Shik Lee, Incheon (KR); Seung Wook Chang, Suwon-si (KR); Byoung Seong Jeong, Suwon-si (KR); Sang Woo Pyo, Seongnam-si (KR); Jae Hoon Hwang, Seoul (KR); Ji Hwan Yoon, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/157,887

(22) Filed: Jan. 25, 2021

(65) Prior Publication Data

US 2021/0151510 A1 May 20, 2021

Related U.S. Application Data

(63) Continuation of application No. 16/741,599, filed on Jan. 13, 2020, now Pat. No. 10,923,538.

(30) Foreign Application Priority Data

Apr. 15, 2019 (KR) .................. 10-2019-0043835

(51) Int. Cl.
H01L 27/32 (2006.01)
H01L 51/50 (2006.01)
H01L 51/52 (2006.01)

(52) U.S. Cl.
CPC .......... *H01L 27/322* (2013.01); *H01L 51/502* (2013.01); *H01L 51/5206* (2013.01); *H01L 51/5234* (2013.01); *H01L 51/5237* (2013.01)

(58) Field of Classification Search
CPC . H01L 27/322; H01L 51/502; H01L 51/5206; H01L 51/5234; H01L 51/5237
(Continued)

(56) References Cited

U.S. PATENT DOCUMENTS 7,663,140 B2   2/2010 Yamazaki et al.
8,076,671 B2   12/2011 Yamazaki et al.
(Continued)

FOREIGN PATENT DOCUMENTS

EP   3 355 357 A1   8/2018
EP   3 654 383 A1   5/2020
(Continued)

OTHER PUBLICATIONS

Extended European Search Report for corresponding European Patent Application No. 20157018.1, dated Sep. 15, 2020, 10 pages.

*Primary Examiner* — Tu-Tu V Ho
(74) *Attorney, Agent, or Firm* — Lewis Roca Rothgerber Christie LLP

(57) ABSTRACT

A display device includes a first base member having a first light-emitting area, a second light-emitting area, and a non-light-emitting area between the first and second light-emitting areas; a second base member on the first base member; a first color filter on a first surface of the second base member that faces the first base member and overlapping with the first light-emitting area; a second color filter on the first surface of the second base member and overlapping with the second light-emitting area; a color pattern on the first surface of the second base member, between the first and second color filters, and overlapping with the non-light- (Continued)

emitting area; a light-shielding member on the color pattern and overlapping with the non-light-emitting area; and a first wavelength conversion pattern on the second color filter and including a first wavelength shifter.

25 Claims, 20 Drawing Sheets

(58) Field of Classification Search
USPC .......................................................... 257/40
See application file for complete search history.

(56) References Cited

U.S. PATENT DOCUMENTS

| | | |
|---|---|---|
| 8,536,569 B2 | 9/2013 | Yamazaki et al. |
| 9,871,090 B2 | 1/2018 | Lee et al. |
| 10,249,689 B2 | 4/2019 | Kim et al. |
| 10,373,978 B2 | 8/2019 | Lee et al. |
| 10,923,538 B2 * | 2/2021 | Lee ..................... H01L 51/5237 |

FOREIGN PATENT DOCUMENTS

| | | |
|---|---|---|
| JP | 2015-128027 A | 7/2015 |
| KR | 10-2011-0124335 A | 11/2011 |
| KR | 10-2017-0034173 A | 3/2017 |
| KR | 10-2017-0051764 A | 5/2017 |
| KR | 10-2017-0080923 A | 7/2017 |
| KR | 10-2018-0002933 A | 1/2018 |
| KR | 10-2018-0087908 A | 8/2018 |
| KR | 10-2018-0114979 A | 10/2018 |
| WO | WO 2020/141650 A1 | 7/2020 |

* cited by examiner

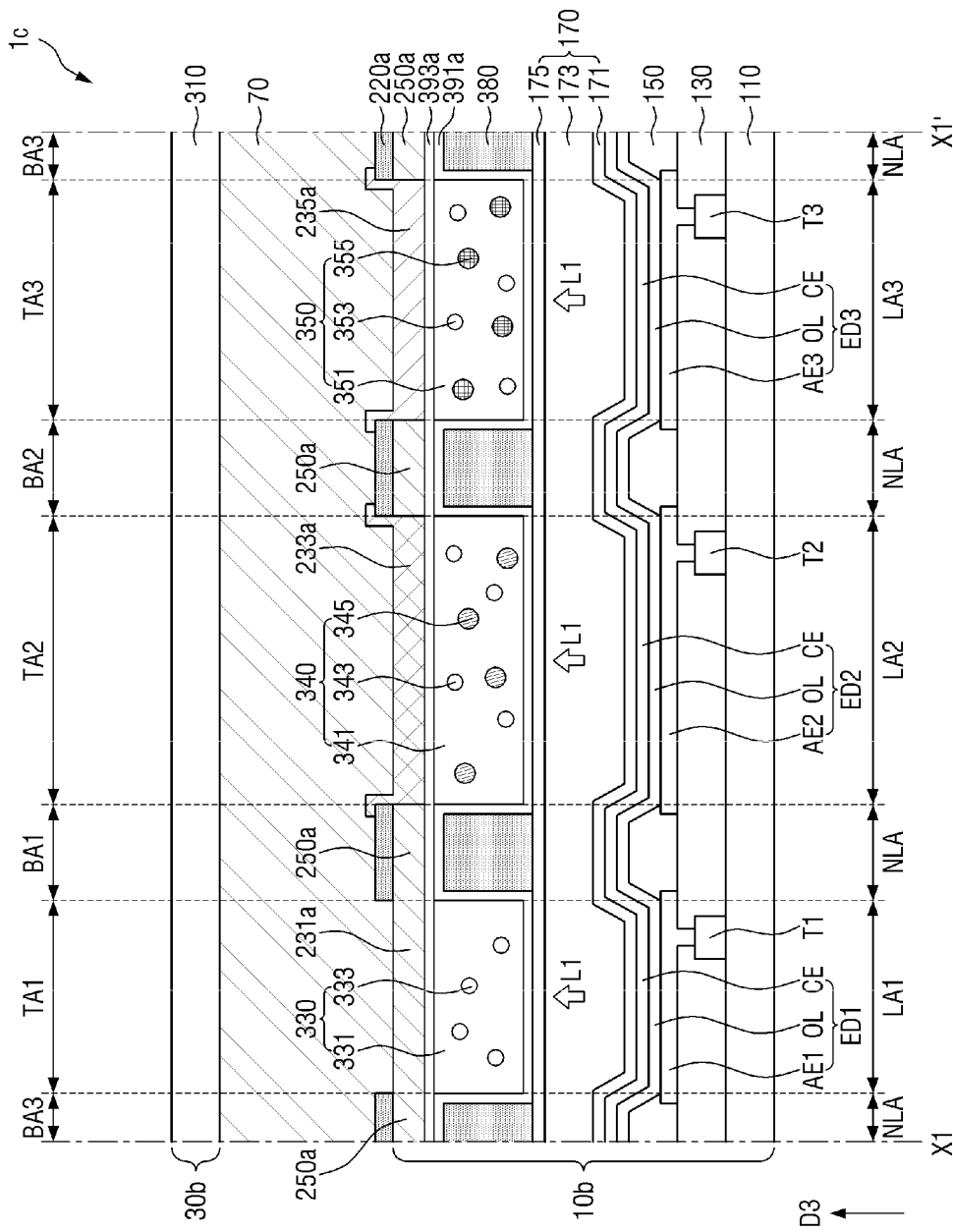

DISPLAY DEVICE

CROSS-REFERENCE TO RELATED APPLICATIONS

This application is a continuation of U.S. patent application Ser. No. 16/741,599, filed Jan. 13, 2020, which claims priority to and the benefit of Korean Patent Application No. 10-2019-0043835, filed Apr. 15, 2019, the entire content of both of which is incorporated herein by reference.

BACKGROUND

1. Field

The present disclosure relates to a display device.

2. Description of the Related Art

Display devices have become of increasingly greater importance with the development of multimedia. Accordingly, various display devices (such as a liquid crystal display (LCD) device, an organic light-emitting diode (OLED) display device, or the like) have been developed.

Meanwhile, a self-luminous display device includes self-luminous elements, e.g., OLEDs. Each of the self-luminous elements may include two electrodes which face each other and a light-emitting layer which is interposed between the two electrodes. In a case where the self-luminous elements are OLEDs, electrons and holes from the two electrodes recombine in the light-emitting layer to generate excitons, and light can be emitted in response to the transition of the excitons from the excited state to the base state.

Because the self-luminous display device does not need a separate light source, the self-luminous display device has become increasingly more popular as a next-generation display device because of its low power consumption, thinness, and numerous high-quality characteristics such as wide viewing angles, high luminance, excellent contrast ratio, and fast response speed.

Meanwhile, in order to allow each pixel of a display device to uniquely display a single basic color, a method in which a color conversion pattern or a wavelength conversion pattern is disposed in each pixel on the path of light from a light source to a viewer has been suggested.

SUMMARY

Aspects according to embodiments of the present disclosure are directed toward a display device capable of improving display quality.

However, embodiments of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device includes: a first base member having a first light-emitting area, a second light-emitting area, and a non-light-emitting area between the first and second light-emitting areas; a first anode electrode on the first base member and located in the first light-emitting area; a second anode electrode on the first base member and located in the second light-emitting area; light-emitting layers on the first and second anode electrodes; a cathode electrode on the light-emitting layers; a second base member on the cathode electrode, the second base member having a first surface facing the first base member; a first color filter on the first surface of the second base member and overlapping with the first light-emitting area; a second color filter on the first surface of the second base member and overlapping with the second light-emitting area; a color pattern on the first surface of the second base member, the color pattern being between the first and second color filters, and overlapping with the non-light-emitting area; a light-shielding member on the color pattern and overlapping with the non-light-emitting area; and a first wavelength conversion pattern on the second color filter and including a first wavelength shifter, wherein the light-emitting layers include first, second, and third light-emitting layers overlapping with one another, the first, second, and third light-emitting layers are to emit light having a peak wavelength of about 440 nm to about 610 nm, one of the first, second, and third light-emitting layers is to emit light of a first peak wavelength, and another one of the first, second, and third light-emitting layers is to emit light of a second peak wavelength different from the first peak wavelength.

According to an embodiment of the present disclosure, a display device includes a base member having a first light-emitting area, a second light-emitting area, and a non-light-emitting area between the first and second light-emitting areas; a first anode electrode on the base member and located in the first light-emitting area; a second anode electrode on the base member and located in the second light-emitting area; light-emitting layers on the first and second anode electrodes; a cathode electrode on the light-emitting layers; a thin-film encapsulation layer on the cathode electrode; a first color filter on the thin-film encapsulation layer and overlapping with the first light-emitting area; a second color filter on the thin-film encapsulation layer and overlapping with the second light-emitting area; a color pattern on the thin-film encapsulation layer, the color pattern between the first and second color filters, and overlapping with the non-light-emitting area; a light-shielding member on the color pattern and overlapping with the non-light-emitting area; a light-transmitting pattern between the first color filter and the thin-film encapsulation layer; and a wavelength conversion pattern between the second color filter and the thin-film encapsulation layer and including a wavelength shifter, wherein the light-emitting layers include first, second, and third light-emitting layers overlapping with one another, the first, second, and third light-emitting layers are to emit light having a peak wavelength of about 440 nm to about 610 nm, one of the first, second, and third light-emitting layers is to emit light of a first peak wavelength, and another one of the first, second, and third light-emitting layers is to emit light of a second peak wavelength different from the first peak wavelength.

According to the aforementioned and other embodiments of the present disclosure, a display device with an improved display quality can be provided.

Other features and embodiments may be apparent from the following detailed description, the drawings, and the claims.

BRIEF DESCRIPTION OF THE DRAWINGS

The above and other embodiments and features of the present disclosure will become more apparent by describing in more detail embodiments thereof with reference to the attached drawings, in which:

FIG. 20 is a cross-sectional view, taken along the line X1-X1' of FIG. 3 or 4, of a display device according to another embodiment of the present disclosure.

DETAILED DESCRIPTION

Figure 1:
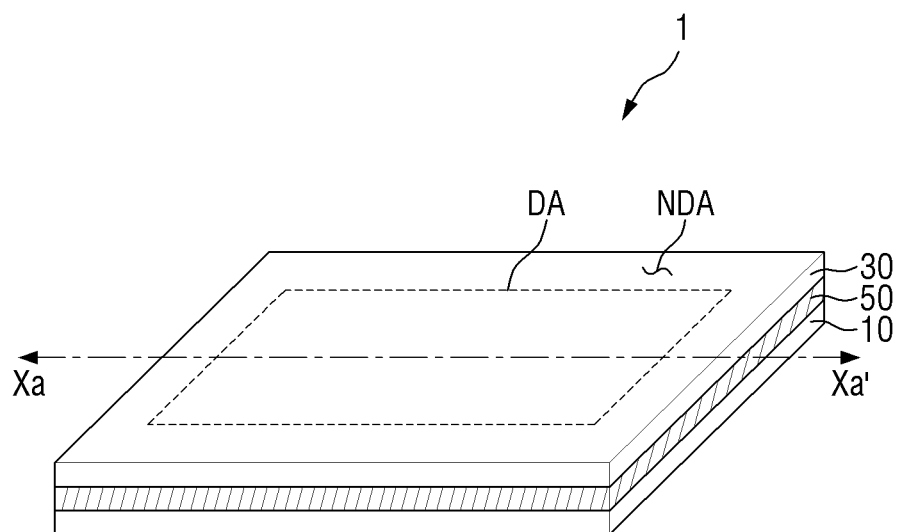
FIG. 1 is a perspective view of a display device according to an embodiment of the present disclosure.
Figure 1:
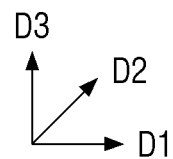

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art. The inventive concept will only be defined by the appended claims, and equivalents thereof. Like reference numerals refer to like elements throughout the specification.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Embodiments to be described herein will be described with reference to plan views and cross-sectional views, which are ideal schematic views of embodiments of the present invention. Thus, illustrations may be modified by manufacturing techniques and/or tolerances. Accordingly, the embodiments of the present invention are not limited to specific forms, and also include the variations caused according to the manufacturing process. Therefore, the regions illustrated in the drawings have schematic attributes, and the shapes of the regions illustrated in the drawings are intended to illustrate specific types of regions of the elements and are not intended to limit the scope of the invention.

Embodiments of the present disclosure will hereinafter be described with reference to the attached drawings.

Figure 2:
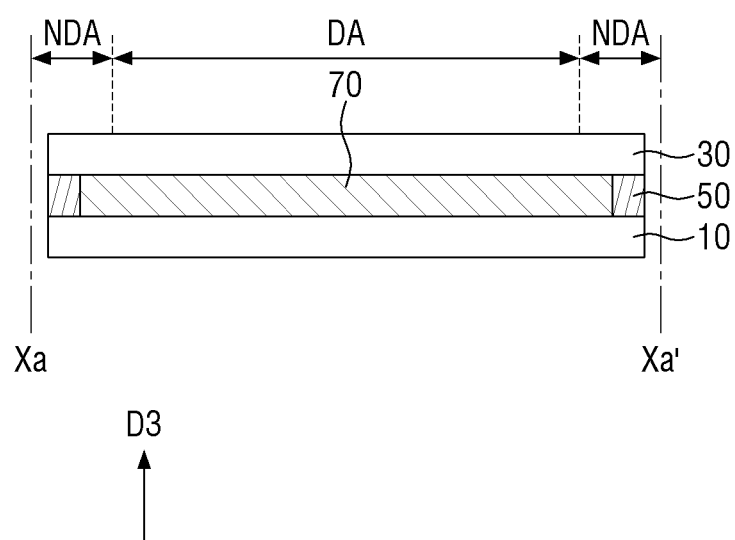
FIG. 2 is a cross-sectional view, taken along the line Xa-Xa' of FIG. 1, of the display device of FIG. 1.
Figure 3:
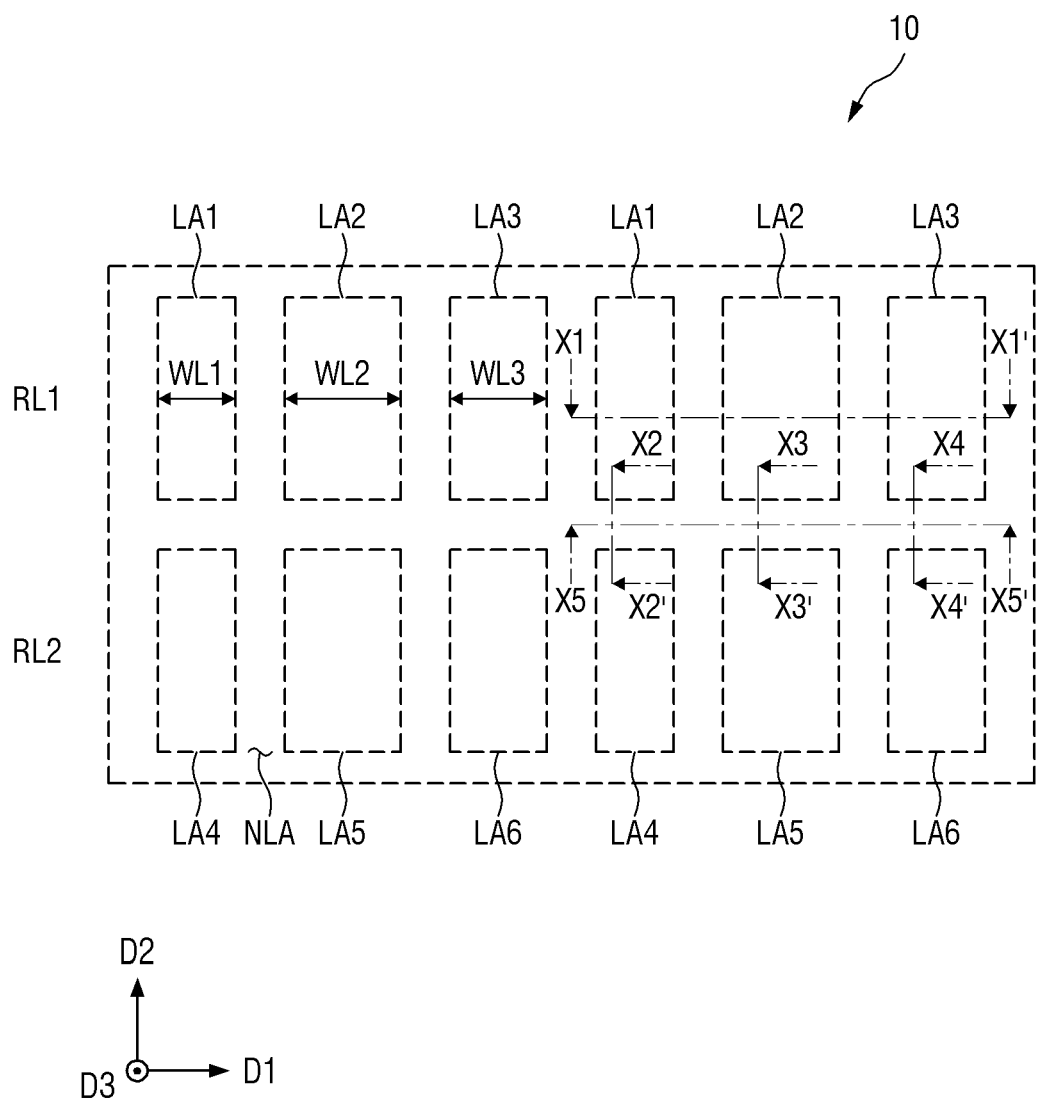
FIG. 3 is a plan view illustrating a display substrate in a display area of the display device of FIG. 1.

FIG. 1 is a perspective view of a display device according to an embodiment of the present disclosure, FIG. 2 is a cross-sectional view, taken along the line Xa-Xa' of FIG. 1, of the display device of FIG. 1, and FIG. 3 is a plan view illustrating a display substrate in a display area of the display device of FIG. 1.

Referring to FIGS. 1 through 3, a display device 1 may be applied to various electronic devices, such as a tablet personal computer (PC), a smartphone, a vehicular navigation unit, a camera, a central information display (CID), a wristwatch-type electronic device, a personal digital assistant (PDA), a portable multimedia player (PMP), a mid- or small-size electronic device (e.g., a gaming console), or a mid- to large-size electronic device (e.g., a television (TV), an outside billboard, a monitor, a PC, or a notebook computer). However, the present disclosure is not limited to this, and the display device 1 may also be applied to various other suitable electronic devices without departing from the inventive concept of the present disclosure.

In some embodiments, the display device 1 may have a rectangular shape in a plan view. The display device 1 may include two first sides extending in a first direction D1 and two second sides extending in a second direction D2 that intersects (e.g., crosses) the first direction D1. The corners at which the first sides and the second sides of the display device 1 meet may be right-angled or curved. In some embodiments, the first sides may be shorter than the second sides, but the present disclosure is not limited thereto. The planar shape of the display device 1 is not particularly limited, and the display device 1 may have a circular shape or another suitable shape in a plan view.

The display device 1 may include a display area DA in which images are displayed and a non-display area NDA in which no images are displayed. In some embodiments, the non-display area NDA may be disposed on the periphery of the display area DA and may surround the display area DA.

Unless specified otherwise, the terms "on", "upper", "top", and "top surface", as used herein, refer to a third direction D3 that intersects (e.g., crosses) the first and second directions D1 and D2, and the terms "below", "lower", "bottom", and "bottom surface", as used herein, refer to the opposite direction of the third direction D3.

In some embodiments, the display device 1 may include a display substrate 10, a color conversion substrate 30 which faces the display substrate 10, and a sealing member 50 which couples the display substrate 10 and the color conversion substrate 30. The display device 1 may further include a filler member 70 which is filled between the display substrate 10 and the color conversion substrate 30.

The display substrate 10 may include elements and circuits for displaying images, e.g., pixel circuits such as switching elements, a pixel-defining film for defining light-emitting areas and a non-light-emitting area in the display area DA, and self-luminous elements. For example, the self-luminous elements may be organic light-emitting diodes (OLEDs), quantum-dot light-emitting diodes (QLEDs), inorganic material-based micro-light-emitting diodes (microLEDs), or inorganic material-based nano-light-emitting diodes (nanoLEDs). For convenience, it is assumed that the self-luminous elements are, for example, OLEDs.

The color conversion substrate 30 may be disposed on the display substrate 10 and may face the display substrate 10. In some embodiments, the color conversion substrate 30 may include color conversion patterns which convert the color of incident light. In some embodiments, the color conversion patterns may include color filters and/or wavelength conversion patterns.

In the non-display area, the sealing member 50 may be disposed between the display substrate 10 and the color conversion substrate 30. The sealing member 50 may be disposed along the edges of the display substrate 10 or the color conversion substrate 30 to surround the display area DA in a plan view. The display substrate 10 and the color conversion substrate 30 may be coupled together via the sealing member 50.

In some embodiments, the sealing member 50 may be formed of an organic material. For example, the sealing member 50 may be formed of an epoxy resin, but the present disclosure is not limited thereto.

The filler member 70 may be disposed in the gap between the display substrate 10 and the color conversion substrate 30, surrounded by the sealing member 50. The filler member 70 may fill the gap between the display substrate 10 and the color conversion substrate 30.

In some embodiments, the filler member 70 may be formed of a material capable of transmitting light therethrough. In some embodiments, the filler member 70 may be formed of an organic material. For example, the filler member 70 may be formed of a silicon (Si)-based organic material or an epoxy-based organic material, but the present disclosure is not limited thereto. In some embodiments, filler member 70 may not be provided.

Figure 4:
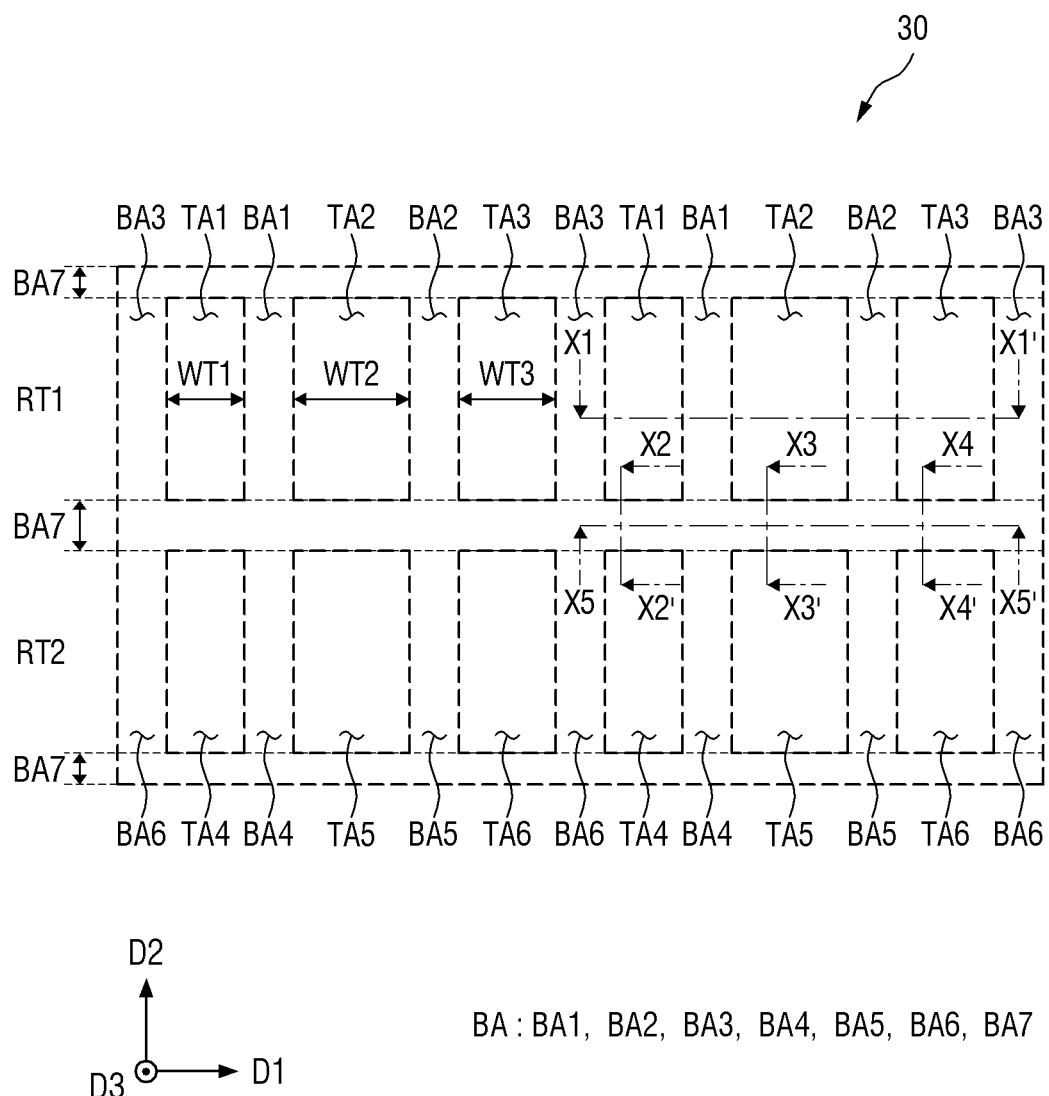
FIG. 4 is a plan view illustrating a color conversion substrate in the display area of the display device of FIG. 1.

FIG. 3 is a plan view illustrating the display substrate in the display area of the display device of FIG. 1, and FIG. 4 is a plan view illustrating the color conversion substrate in the display area of the display device of FIG. 1.

Referring to FIGS. 3 and 4 and again to FIGS. 1 and 2, in the display area DA, a plurality of light-emitting areas (LA1, LA2, LA3, LA4, LA5, and LA6) and a non-light-emitting area NLA may be defined on the display substrate 10. The light-emitting areas (LA1, LA2, LA3, LA4, LA5, and LA6) may be areas that emit light generated by the self-luminous elements to the outside of the display substrate 10, and the non-light-emitting area NLA may be an area that does not emit light to the outside of the display substrate 10.

In some embodiments, light emitted from the light-emitting areas (LA1, LA2, LA3, LA4, LA5, and LA6) to the outside of the display substrate 10 may have a first color. In some embodiments, light of the first color may be blue light and may have a peak wavelength of about 440 nm to about 480 nm.

In some embodiments, in the display area DA, first light-emitting areas LA1, second light-emitting areas LA2, and third light-emitting areas LA3 may be sequentially arranged in a first row RL1 of the display substrate 10 along the first direction D1, and fourth light-emitting areas LA4, fifth light-emitting areas LA5, and sixth light-emitting areas LA6 may be sequentially arranged, along the first direction D1, in a second row RL2 of the display substrate 10 which is adjacent to the first row RL1 in the second direction D2.

In some embodiments, a first width WL1, in the first direction D1, of the first light-emitting areas LA1 may be smaller than a second width WL2, in the first direction D1, of the second light-emitting areas LA2 and a third width WL3, in the first direction D1, of the third light-emitting areas LA3. In some embodiments, the second width WL2 of the second light-emitting areas LA2 and the third width WL3 of the third light-emitting areas LA3 may differ from each other. For example, the second width WL2 of the second light-emitting areas LA2 may be greater than the third width WL3 of the third light-emitting areas LA3. In some embodiments, the area of the first light-emitting areas LA1 may be smaller than the areas of the second and third light-emitting areas LA2 and LA3. The area of the second light-emitting areas LA2 may be smaller or greater than the area of the third light-emitting areas LA3. However, the present disclosure is not limited to this. In other embodiments, the first width WL1 of the first light-emitting areas LA1, the second width WL2 of the second light-emitting areas LA2, and the third width WL3 of the third light-emitting areas LA3 may all be substantially the same. Also, in other embodiments, the areas of the first, second, and third light-emitting areas LA1, LA2, and LA3 may all be substantially the same.

The fourth light-emitting areas LA4, which are adjacent to the respective first light-emitting areas LA1 in the second direction D2, differ from the first light-emitting areas LA2 only in that they are disposed in the second row RL2, and may be substantially the same as the first light-emitting areas LA1 in terms of the width and area thereof and the configuration of elements therein.

Similarly, the second and fifth light-emitting areas LA2 and LA5, which are adjacent to each other in the second direction D2, may have substantially the same structure, and the third and sixth light-emitting areas LA3 and LA6, which are adjacent to each other in the second direction D2, may have substantially the same structure.

In the display area DA, a plurality of light-transmitting areas (TA1, TA2, TA3, TA4, TA5, and TA6) and a light-blocking area BA may be defined on the color conversion substrate 30. The light-transmitting areas (TA1, TA2, TA3, TA4, TA5, and TA6) may be areas that provide light emitted from the display substrate 10 through the color conversion substrate 30 to the outside of the display device 1. The light-blocking area BA may be an area that does not transmit light emitted from the display substrate 10 therethrough.

In some embodiments, in the display area DA, first light-transmitting areas TA1, second light-transmitting areas TA2, and third light-transmitting areas TA3 may be sequentially arranged in a first row RT1 of the color conversion substrate 30 along the first direction D1. The first light-transmitting areas TA1 may correspond to, or overlap with, the first light-emitting areas LA1. Similarly, the second light-transmitting areas TA2 and the third light-transmitting areas TA3 may correspond to, or overlap with, the second light-emitting areas LA2 and the third light-emitting areas LA3, respectively.

In some embodiments, light of the first color provided by the display substrate 10 may be provided to the outside of the display device 1 through the first, second, and third light-transmitting areas TA1, TA2, and TA3. The color of the first emitted light, which is light emitted to the outside of the display device 1 through the first light-transmitting areas TA1, may be the first color, the color of the second emitted light, which is light emitted to the outside of the display device 1 through the second light-transmitting areas TA2, may be a second color, which is different from the first color, and the color of light emitted to the outside of the display device 1 through the third light-transmitting areas TA3 (e.g., the third emitted light) may be a third color, which is different from the first and second colors. In some embodiments, light of the first color may be blue light having a peak wavelength of about 440 nm to about 480 nm, light of the second color may be red light having a peak wavelength of about 610 nm to about 650 nm, and light of the third color may be green light having a peak wavelength of about 510 nm to about 550 nm.

Fourth, fifth, and sixth light-transmitting areas TA4, TA5, and TA6 may be sequentially arranged, along the first direction D1, in a second row RT2 of the color conversion substrate 30 which is adjacent to the first row RT1 in the second direction D2. The fourth, fifth, and sixth light-transmitting areas TA4, TA5, and TA6 may correspond to, or overlap with, the fourth, fifth, and sixth light-emitting areas LA1, LA2, and LA3, respectively.

In some embodiments, a first width WT1, in the first direction D1, of the first light-transmitting areas TA1 may be smaller than a second width WL2, in the first direction D1, of the second light-transmitting areas TA2 and a third width WL3, in the first direction D1, of the third light-transmitting areas TA3. In some embodiments, the second width WL2 of the second light-transmitting areas TA2 and the third width WL3 of the third light-transmitting areas TA3 may differ from each other. For example, the second width WL2 of the second light-transmitting areas TA2 may be greater than the third width WL3 of the third light-transmitting areas TA3. In some embodiments, the area of the first light-transmitting areas TA1 may be smaller than the areas of the second and third light-transmitting areas TA2 and TA3.

The first and fourth light-transmitting areas TA1 and TA4, which are adjacent to each other in the second direction D2, may be substantially the same in terms of the width and area thereof, the configuration of elements therein, and the color of light emitted therefrom to the outside of the display device 1.

Similarly, the second and fifth light-transmitting areas TA2 and TA5, which are adjacent to each other in the second direction D2, may have substantially the same structure and may emit light of substantially the same color to the outside of the display device 1. Also, the third and sixth light-transmitting areas TA3 and TA6, which are adjacent to each other in the second direction D2, may have substantially the same structure and may emit light of substantially the same color to the outside of the display device 1.

In the display area DA, the light-blocking area BA may be disposed on the periphery of the light-transmitting areas (TA1, TA2, TA3, TA4, TA5, and TA6) of the color conversion substrate 30. In some embodiments, the light-blocking area BA may include first light-blocking areas BA1, second light-blocking areas BA2, third light-blocking areas BA3, fourth light-blocking areas BA4, fifth light-blocking areas BA5, sixth light-blocking areas BA6, and seventh light-blocking areas BA7.

The first light-blocking areas BA1 may be disposed between the respective first light-transmitting areas TA1 and the respective second light-transmitting areas TA2 along the first direction D1, the second light-blocking areas BA2 may be disposed between the respective second light-transmitting areas TA2 and the respective third light-transmitting areas TA3 along the first direction D1, and the third light-blocking areas BA3 may be disposed between the respective third light-transmitting areas TA3 and the respective first light-transmitting areas TA1 along the first direction D1.

The fourth light-blocking areas BA4 may be disposed between the respective fourth light-transmitting areas TA4 and the respective fifth light-transmitting areas TA5 along the first direction D1, the fifth light-blocking areas BA5 may be disposed between the respective fifth light-transmitting areas TA5 and the respective sixth light-transmitting areas TA6 along the first direction D1, and the sixth light-blocking areas BA6 may be disposed between the respective sixth light-transmitting areas TA6 and the respective fourth light-transmitting areas TA4 along the first direction D1.

The seventh light-blocking areas BA7 may be disposed between the first and second rows RT1 and RT2, which are adjacent to each other in the second direction D2.

The structure of the display device 1 will hereinafter be described.

Figure 5:
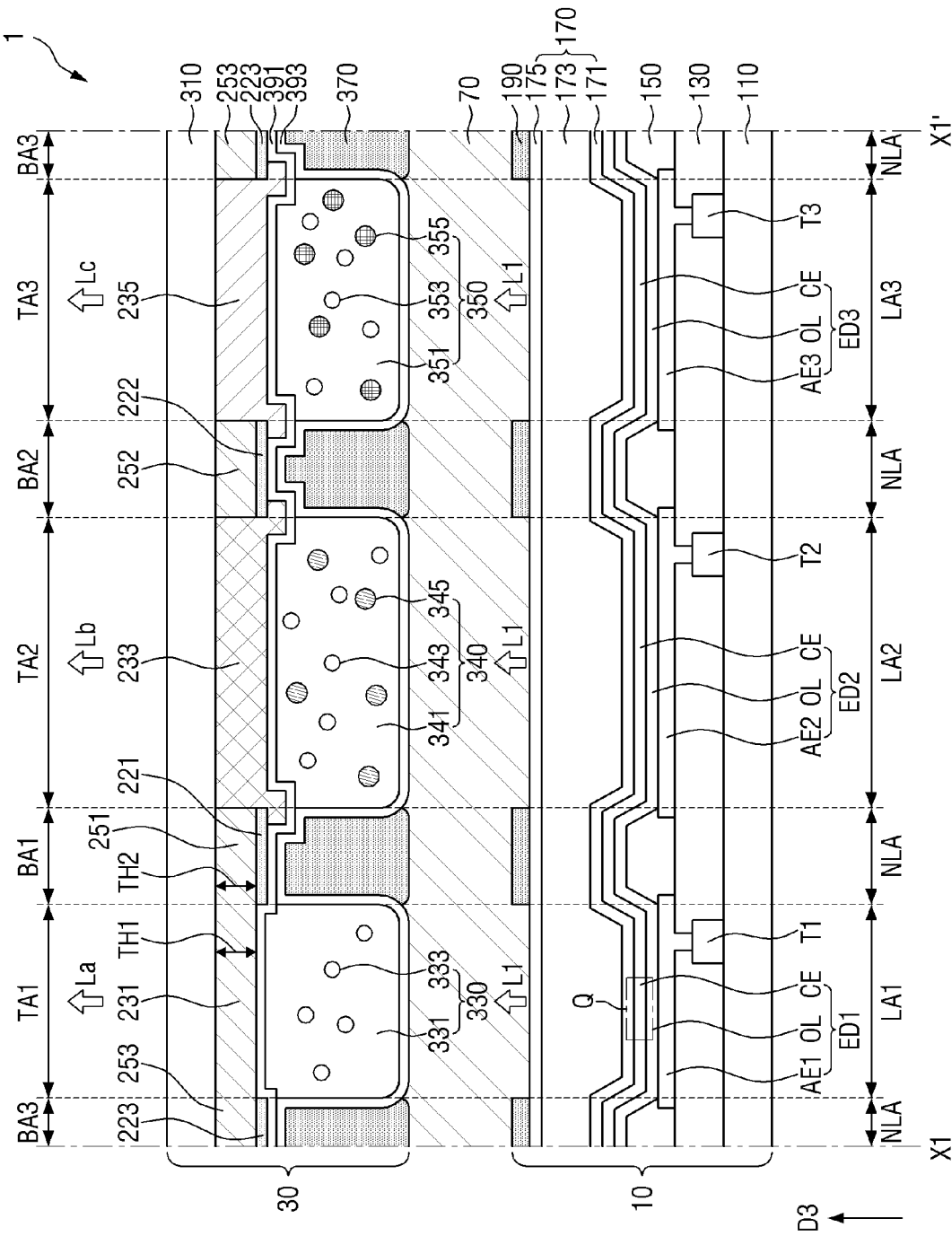
FIG. 5 is a cross-sectional view, taken along the line X1-X1' of FIG. 3 or 4, of the display device of FIG. 1.
Figure 6:
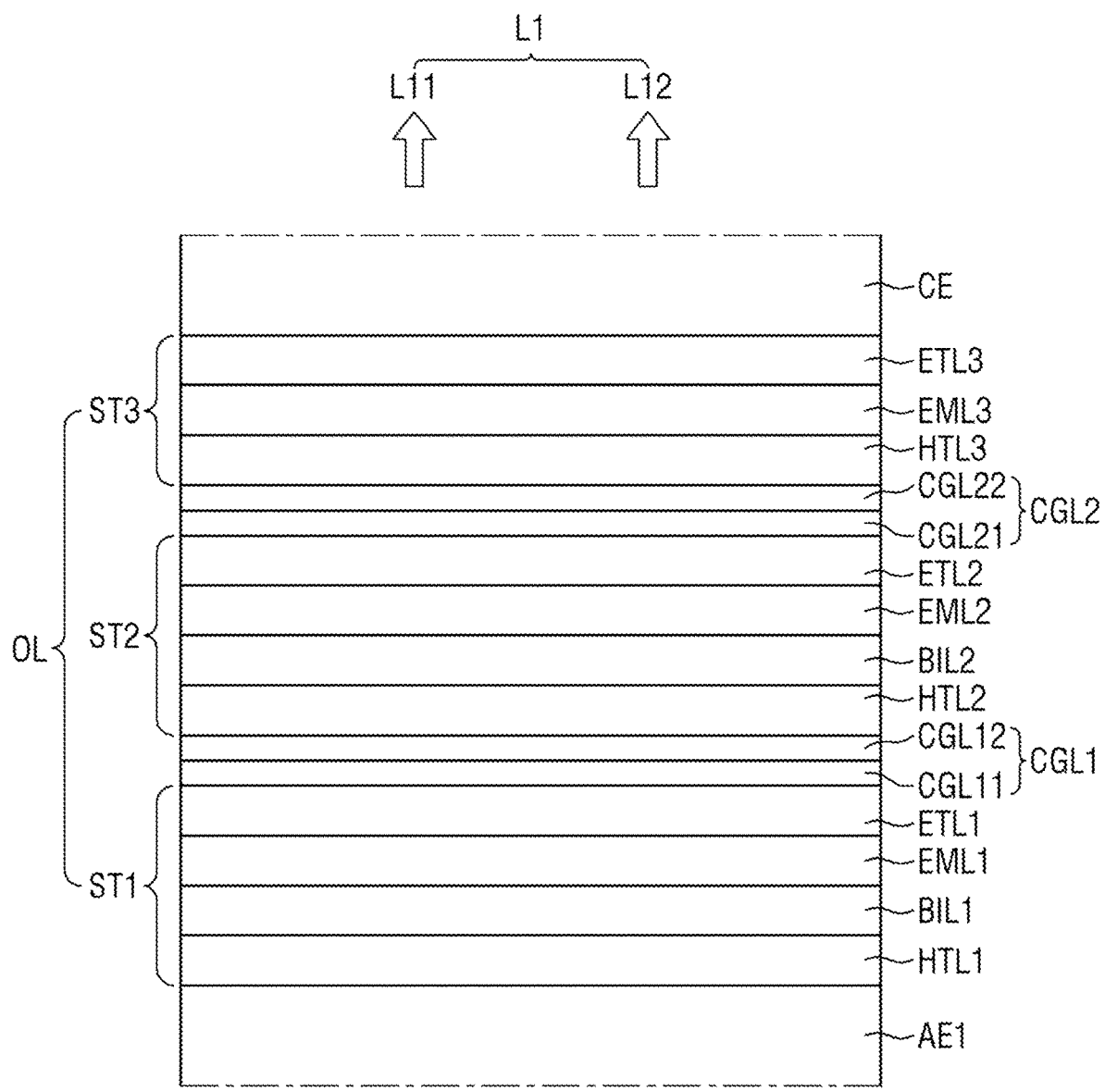
FIG. 6 is an enlarged cross-sectional view of a part Q of FIG. 5.
Figure 7:
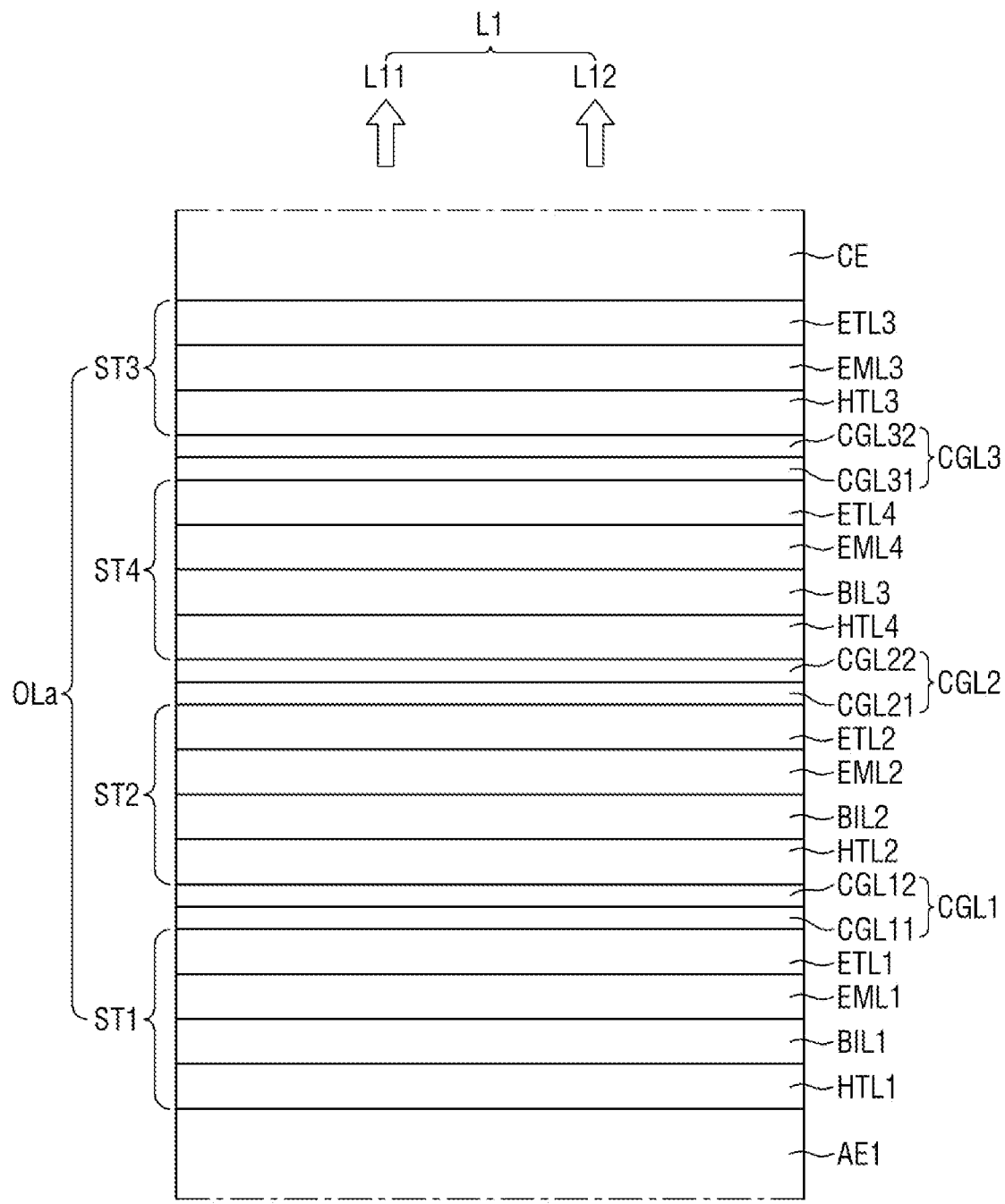
FIG. 7 is an enlarged cross-sectional view of a modified example of the part Q of FIG. 6.
Figure 8:
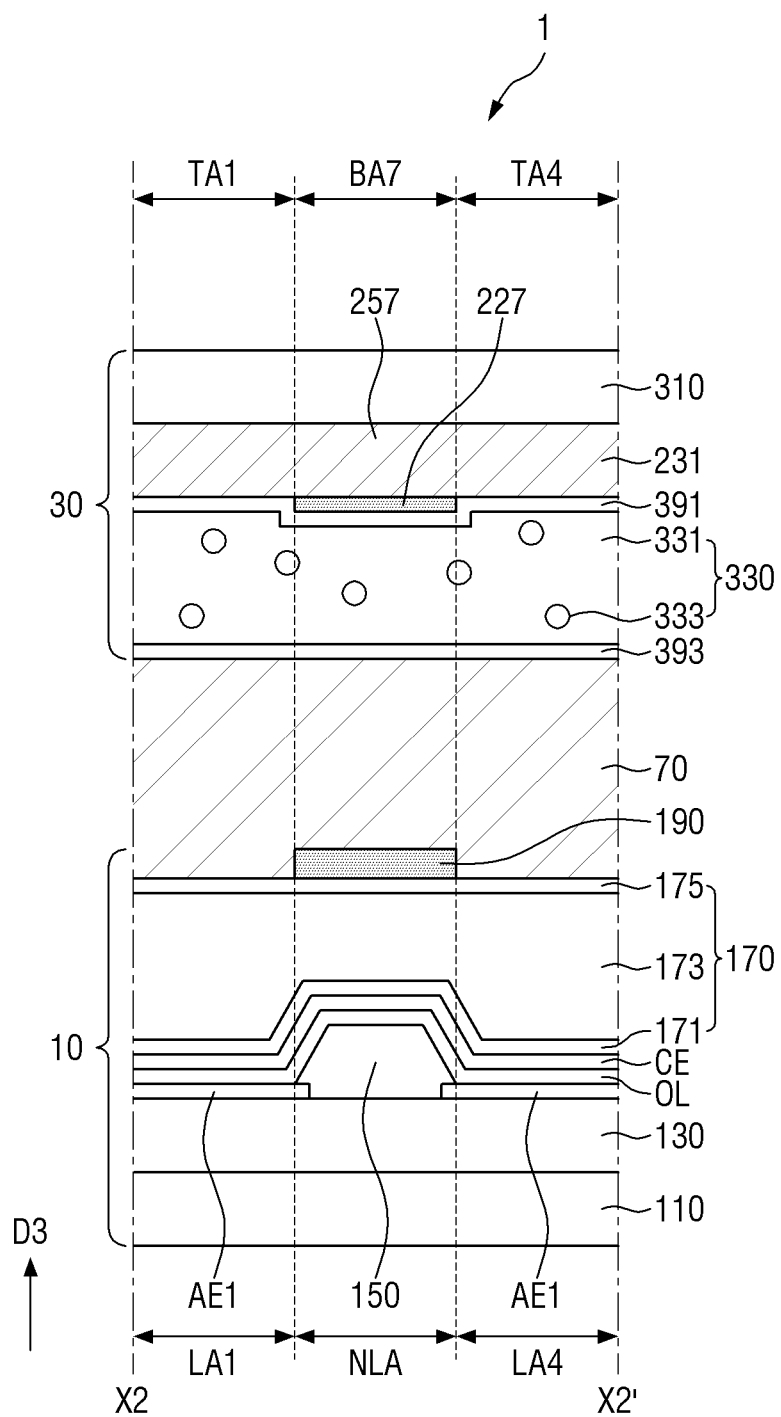
FIG. 8 is a cross-sectional view, taken along the line X2-X2' of FIG. 3 or 4, of the display device of FIG. 1.
Figure 9:
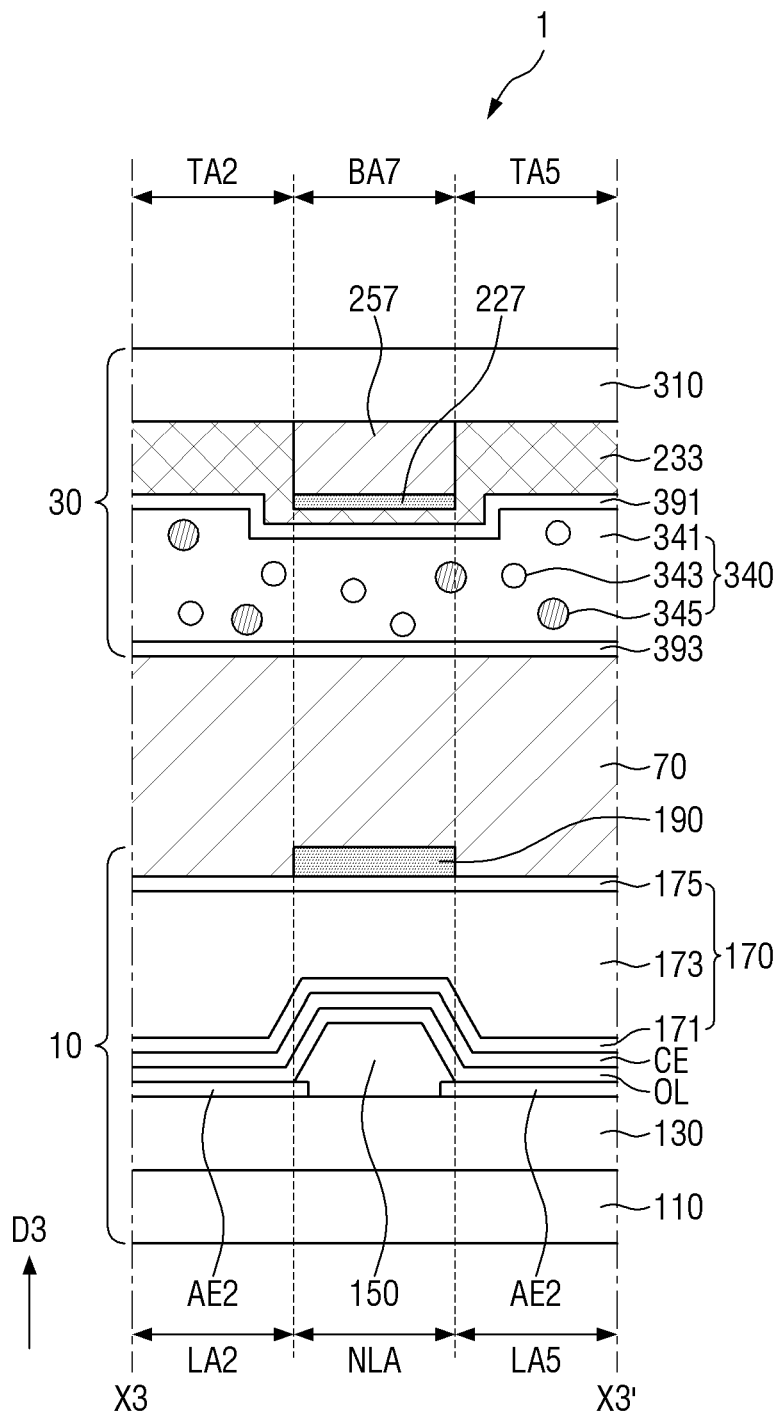
FIG. 9 is a cross-sectional view, taken along the line X3-X3' of FIG. 3 or 4, of the display device of FIG. 1.
Figure 10:
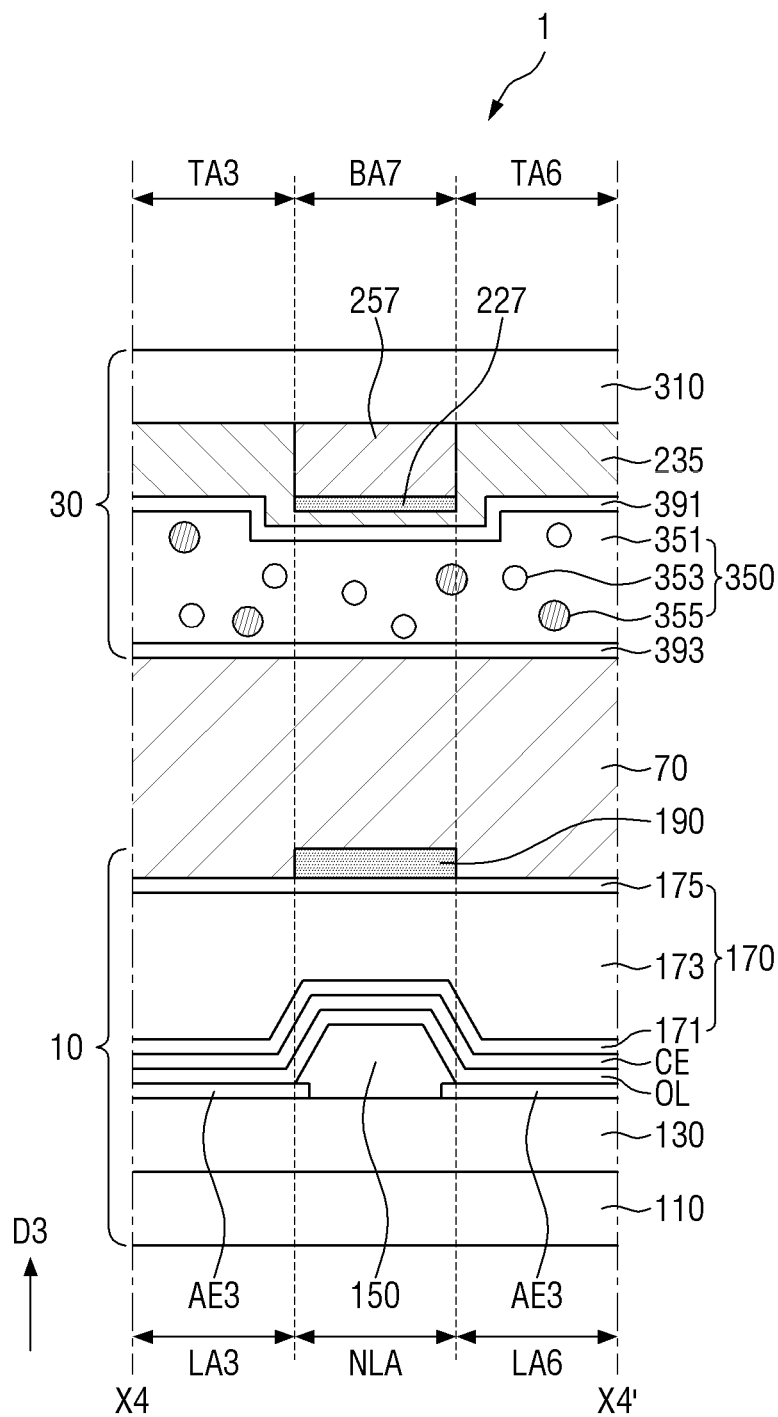
FIG. 10 is a cross-sectional view, taken along the line X4-X4' of FIG. 3 or 4, of the display device of FIG. 1.
Figure 11:
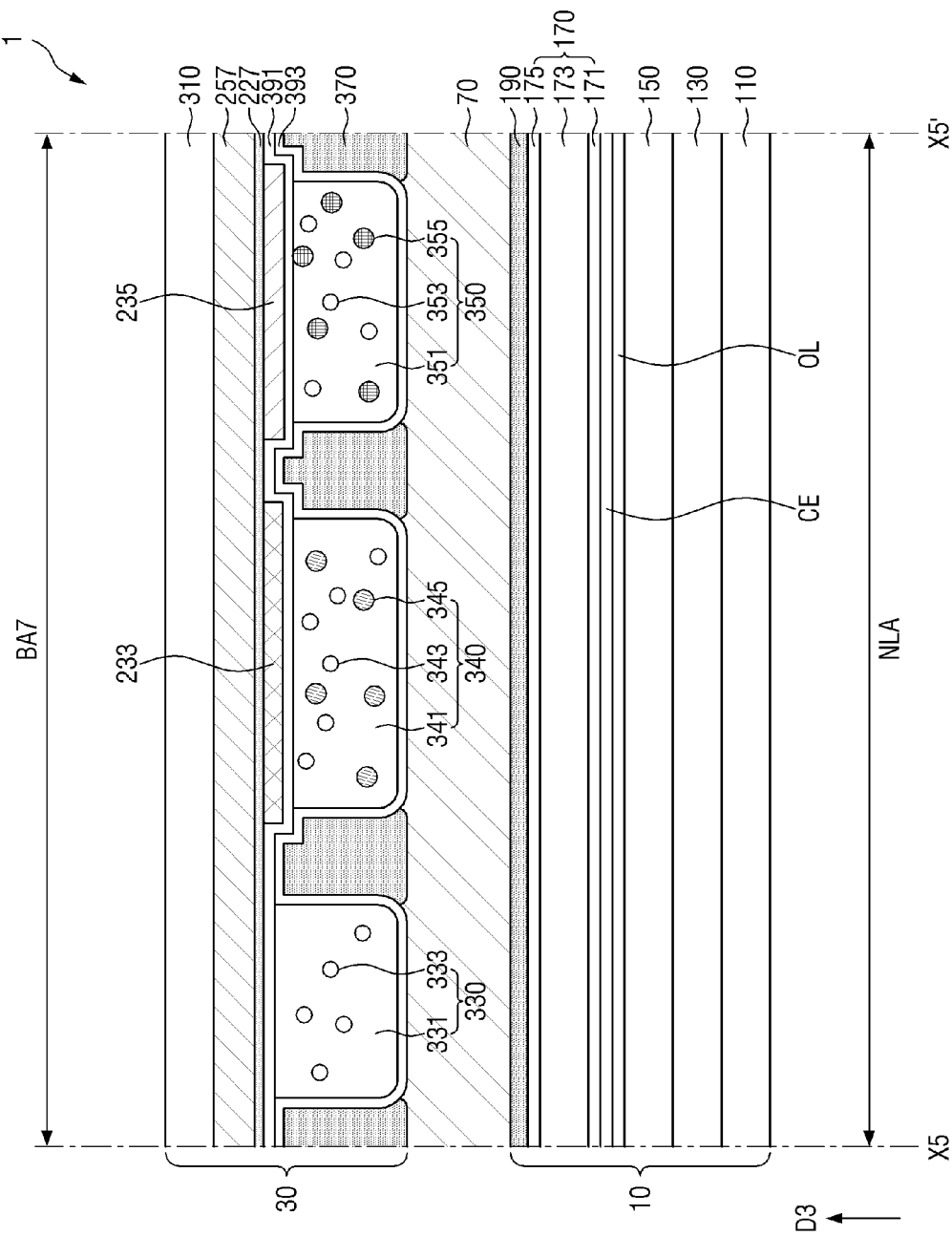
FIG. 11 is a cross-sectional view, taken along the line X5-X5' of FIG. 3 or 4, of the display device of FIG. 1.

FIG. 5 is a cross-sectional view, taken along the line X1-X1' of FIG. 3 or 4, of the display device of FIG. 1, FIG. 6 is an enlarged cross-sectional view of a part Q of FIG. 5, FIG. 7 is an enlarged cross-sectional view of a modified example of the part Q of FIG. 6, FIG. 8 is a cross-sectional view, taken along the line X2-X2' of FIG. 3 or 4, of the display device of FIG. 1, FIG. 9 is a cross-sectional view, taken along the line X3-X3' of FIG. 3 or 4, of the display device of FIG. 1, FIG. 10 is a cross-sectional view, taken along the line X4-X4' of FIG. 3 or 4, of the display device of FIG. 1, and FIG. 11 is a cross-sectional view, taken along the line X5-X5' of FIG. 3 or 4, of the display device of FIG. 1. Here, the lines X1-X1', X2-X2', X3-X3', X4-X4', and X5-X5' in FIG. 3 are in the same positions of the display device of FIG. 1 as the respective lines X1-X1', X2-X2', X3-X3', X4-X4', and X5-X5' in FIG. 4.

Referring to FIGS. 5 through 11 and again to FIGS. 3-4, the display device 1 may include the display substrate 10 and the color conversion substrate 30 and may further include the filler member 70, which is disposed between the display substrate 10 and the color conversion substrate 30.

The display substrate 10 will hereinafter be described.

A first base member 110 may be formed of a material having transparency. In some embodiments, the first base member 110 may be a glass substrate or a plastic substrate. In a case where the first base member 110 is a plastic substrate, the first base member 110 may have flexibility. In some embodiments, the first base member 110 may include a glass or plastic substrate and may further include a separate layer, e.g., a buffer layer or an insulating layer, which is disposed on the glass or plastic substrate.

In some embodiments, as already mentioned above, the light-emitting areas (LA1, LA2, LA3, LA4, LA5, and LA6) and the non-light-emitting area NLA may be defined on the first base member 110.

As illustrated in FIG. 5, switching elements (T1, T2, and T3) may be disposed on the first base member 110. In some embodiments, first, second, and third switching elements T1, T2, and T3 may be disposed in the first, second, and third light-emitting areas LA1, LA2, and LA3, respectively, but the present disclosure is not limited thereto. In other embodiments, at least one of the first, second, and third switching elements T1, T2, and T3 may be disposed in the non-light-emitting area NLA.

In some embodiments, the first, second, and third switching elements T1, T2, and T3 may be thin-film transistors (TFTs) including polysilicon or an oxide semiconductor.

In one embodiment, a plurality of signal lines (e.g., gate lines, data lines, power lines, and/or the like) may be further disposed on the first base member 110 to transmit signals to the switching elements (T1, T2, and T3).

An insulating film 130 may be disposed on the first, second, and third switching elements T1, T2, and T3. In some embodiments, the insulating film 130 may be a planarization film. In some embodiments, the insulating film 130 may be formed as an organic film. For example, the insulating film 130 may include an acrylic resin, an epoxy resin, an imide resin, or an ester resin. In some embodiments, the insulating film 130 may include a positive photosensitive material or a negative photosensitive material.

As illustrated in FIGS. 5 and 8 through 10, first, second, and third anode electrodes AE1, AE2, and AE3 may be disposed on the insulating film 130. The first anode electrode AE1 may be disposed in the first light-emitting area LA1 and may at least partially extend to the non-light-emitting area NLA, the second anode electrode AE2 may be disposed in the second light-emitting area LA2 and may at least partially extend to the non-light-emitting area NLA, and the third first anode electrode AE3 may be disposed in the third light-emitting area LA3 and may at least partially extend to the non-light-emitting area NLA. The first, second, and third anode electrodes AE1, AE2, and AE3 may penetrate the insulating film 130 to be connected to the first, second, and third switching elements T1, T2, and T3, respectively.

In some embodiments, the first, second, and third anode electrodes AE1, AE2, and AE3 may have different widths or different areas. For example, the width of the first anode electrode AE1 may be smaller than the width of the second anode electrode AE2, and the width of the third anode electrode AE3 may be smaller than the width of the second anode electrode AE2, but greater than the width of the first anode electrode AE1. For example, the area of the first anode electrode AE1 may be smaller than the area of the second anode electrode AE2, and the area of the third anode electrode AE3 may be smaller than the area of the second anode electrode AE2, but greater than the area of the first anode electrode AE1. In another example, the area of the first anode electrode AE1 may be smaller than the area of the second anode electrode AE2, and the area of the third anode electrode AE3 may be greater than the areas of the first and second anode electrodes AE1 and AE2. However, the present disclosure is not limited to these examples. In another example, the first, second, and third anode electrodes AE1, AE2, and AE3 may have substantially the same width or substantially the same area.

The first, second, and third anode electrodes AE1, AE2, and AE3 may be reflective electrodes, in which case, each of the first, second, and third anode electrodes AE1, AE2, and AE3 may include a metal layer formed of a metal such as Ag, Mg, Al, Pt, Pd, Au, Ni, Nd, Ir, or Cr. In some embodiments, each of the first, second, and third anode electrodes AE1, AE2, and AE3 may further include a metal oxide layer which is deposited on the metal layer. For example, the first, second, and third anode electrodes AE1, AE2, and AE3 may have a double-layer structure of ITO/Ag, Ag/ITO, ITO/Mg, ITO/MgF or a multilayer structure of ITO/Ag/ITO.

A pixel-defining film 150 may be disposed on the first, second, and third anode electrodes AE1, AE2, and AE3. The pixel-defining film 150 may include openings which expose the first, second, and third anode electrodes AE1, AE2, and AE3 and may define the first, second, and third light-emitting areas LA1, LA2, and LA3 and the non-light-emitting area NLA. That is, part of the first anode electrode AE1 that is not covered, but exposed, by the pixel-defining film 150 may correspond to the first light-emitting area LA1, part of the second anode electrode AE2 that is not covered, but exposed, by the pixel-defining film 150 may correspond to the second light-emitting area LA2, and part of the third anode electrode AE3 that is not covered, but exposed, by the pixel-defining film 150 may correspond to the third light-emitting area LA3. An area in which the pixel-defining film 150 is disposed may be the non-light-emitting area NLA.

In some embodiments, the pixel-defining film 150 may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB).

Figure 12:
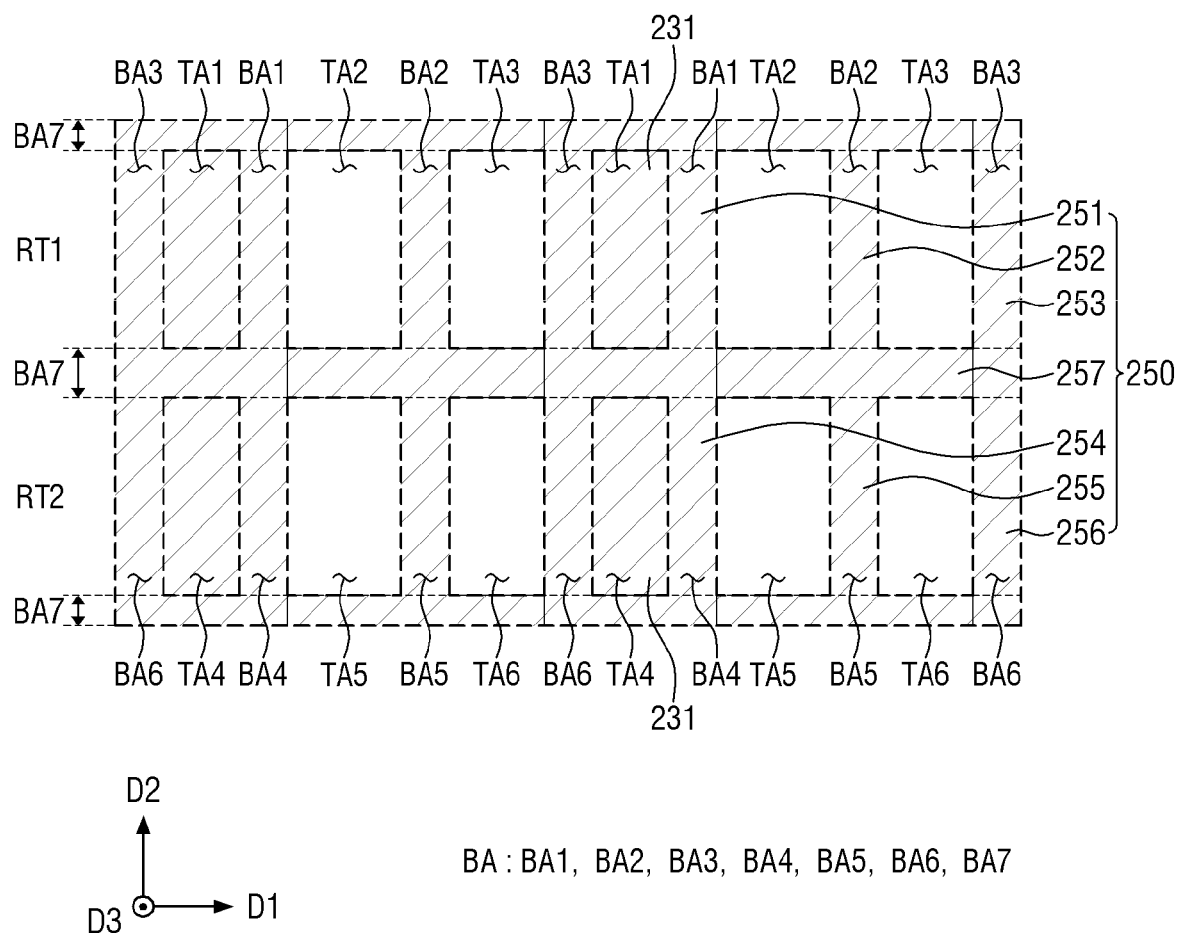
FIG. 12 is a plan view illustrating the arrangement of first color filters and color patterns in the color conversion substrate of the display device of FIG. 1.
Figure 13:
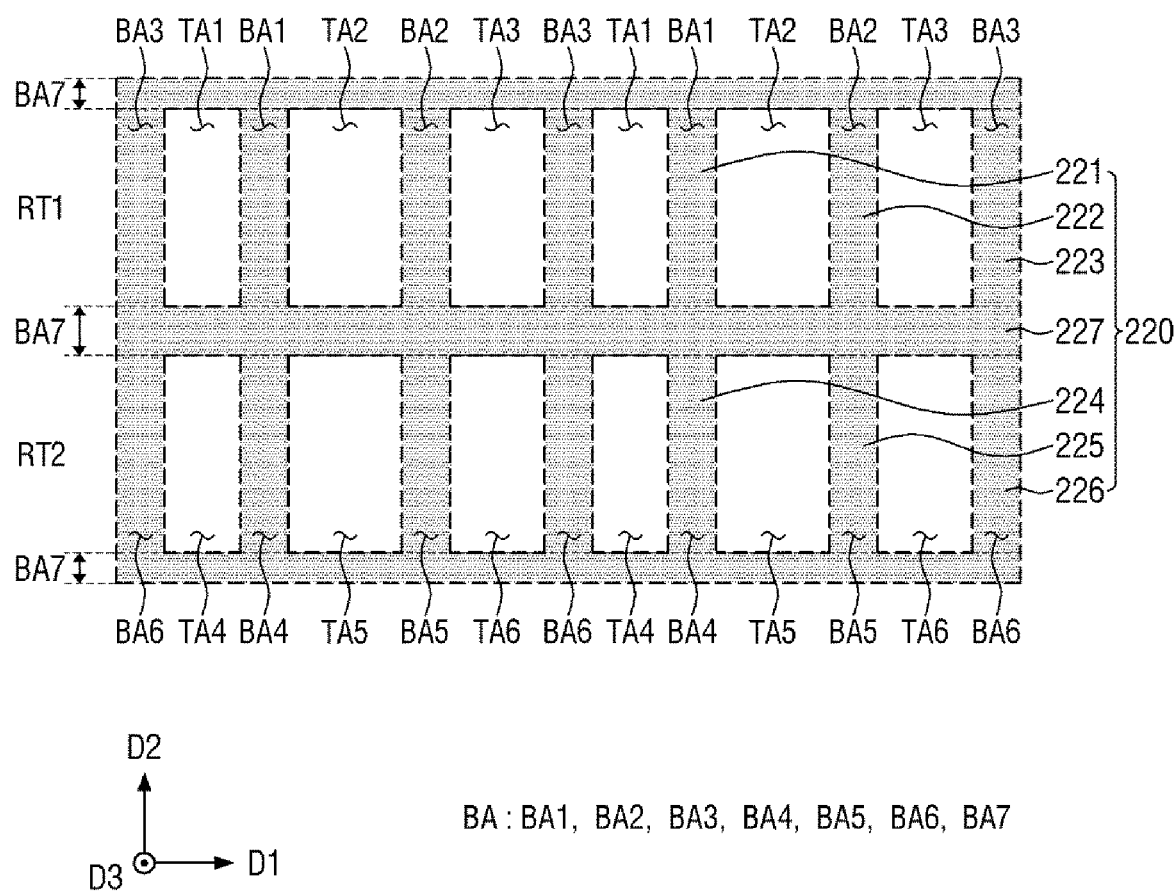
FIG. 13 is a plan view illustrating the arrangement of a light-shielding member in the color conversion substrate of the display device of FIG. 1.

In some embodiments, the pixel-defining film 150 may overlap with color patterns 250 of FIG. 12 and light-shielding members 220 of FIG. 13. For example, as illustrated in FIG. 5, the pixel-defining film 150 may overlap with first, second, and third light-shielding members 221, 222, and 223. Also, the pixel-defining film 150 may overlap with first, second, and third color patterns 251, 252, and 253.

The pixel-defining film 150 may overlap with color mixing-preventing members 370.

As illustrated in FIGS. 5 and 8 through 11, a light-emitting layer OL may be disposed on the first, second, and third anode electrodes AE1, AE2, and AE3.

In some embodiments, the light-emitting layer OL may be in the shape of a continuous film formed in and across the light-emitting areas (LA1, LA2, LA3, LA4, LA5, and LA6) and the non-light-emitting area NLA.

As illustrated in FIGS. 5 and 8 through 11, a cathode electrode CE may be disposed on the light-emitting layer OL.

In some embodiments, the cathode electrode CE may have translucency or transparency. In a case where the cathode electrode CE is translucent, the cathode electrode CE may include Ag, Mg, Cu, Al, Pt, Pd, Au, Ni, Nd, Ir, Cr, Li, Ca, LiF/Ca, LiF/Al, Mo, Ti, or a compound or mixture thereof, e.g., the mixture of Ag and Mg. In a case where the cathode electrode CE is tens to hundreds of angstroms in thickness, the cathode electrode CE may be translucent.

In a case where the cathode electrode CE is transparent, the cathode electrode CE includes a transparent conductive oxide (TCO). For example, the cathode CE may include tungsten oxide (WxOx), titanium oxide ($TiO_2$), indium tin oxide (ITO), indium zinc oxide (IZO), zinc oxide (ZnO), indium tin zinc oxide (ITZO), or magnesium oxide (MgO).

The first anode electrode AE1, the light-emitting layer OL, and the cathode electrode CE may form a first light-emitting element ED1, the second anode electrode AE2, the light-emitting layer OL, and the cathode electrode CE may form a second light-emitting element ED2, and the third anode electrode AE3, the light-emitting layer OL, and the cathode electrode CE may form a third light-emitting element ED3. The first, second, and third light-emitting elements ED1, ED2, and ED3 may emit emitted light L1, and the emitted light L1 may be provided to the color conversion substrate 30.

As illustrated in FIG. 6, the emitted light L1, which is emitted finally by the light-emitting element OL, may be the mixture of first and second components L11 and L12. The first and second components L11 and L12 may have a peak wavelength of about 440 nm to about 610 nm. That is, the emitted light L1 may not include a red-light component. Here, the term "peak wavelength", as used herein, may refer to the wavelength where the spectrum reaches its maximum intensity.

The light-emitting layer OL may include a first stack ST1 which includes a first light-emitting layer EML1, a second stack ST2 which is disposed on the first stack ST1 and includes a second light-emitting layer EML2, a third stack ST3 which is disposed on the second stack ST2 and includes a third light-emitting layer EML3, a first charge generating layer CGL1 which is disposed between the first and second stacks ST1 and ST2, and a second charge generating layer CGL2 which is disposed between the second and third stacks ST2 and ST3. The first, second, and third stacks ST1, ST2, and ST3 may be disposed to overlap with one another.

The first, second, and third light-emitting layers EML1, EML2, and EML3 may be disposed to overlap with one another.

In some embodiments, light emitted by the first, second, and third light-emitting layers EML1, EML2, and EML3 may have a peak wavelength of less than 610 nm, and the first, second, and third light-emitting layers EML1, EML2, and EML3 may not emit light having a peak wavelength of about 610 nm to about 680 nm, i.e., red light.

In some embodiments, the first, second, and third light-emitting layers EML1, EML2, and EML3 may emit light of the first color, i.e., blue light. For example, the first, second, and third light-emitting layers EML1, EML2, and EML3 may all be blue light-emitting layers and may include an organic material.

In some embodiments, at least one of the first, second, and third light-emitting layers EML1, EML2, and EML3 may emit a first blue light having a first peak wavelength, and the other light-emitting layer(s) may emit a second blue light having a second peak wavelength, which is different from the first peak wavelength. For example, one of the first, second, and third light-emitting layers EML1, EML2, and EML3 may emit the first blue light having the first peak wavelength, and the other two light-emitting layers may emit the second blue light having the second peak wavelength. That is, the emitted light L1, which is emitted finally by the light-emitting element OL, may be the mixture of the first and second components L11 and L12, the first component L11 may be the first blue light having the first peak wavelength, and the second component L12 may be the second blue light having the second peak wavelength.

In some embodiments, one of the first and second peak wavelengths may range from about 440 nm to about 460 nm, and the other peak wavelength may range from about 460 nm to about 480 nm. However, the first and second peak wavelengths are not particularly limited. In other embodiments, the first and second peak wavelengths may both include 460 nm. In some embodiments, one of the first blue light and the second blue light may be deep blue light, and the other blue light may be sky blue light.

In some embodiments, the emitted light L1, which is emitted from the light-emitting layer OL, may be blue light and may include both long- and short-wavelength components. Thus, the light-emitting layer OL can emit blue light having a broad range of emission peaks as the emitted light L1. As a result, color visibility at a side viewing angle can be improved as compared to conventional light-emitting elements that emit blue light having sharp emission peaks.

In some embodiments, each of the first, second, and third light-emitting layers EML1, EML2, and EML3 may include a host and a dopant. The material of the host is not particularly limited. For example, tris(8-hydroxyquinoline) aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-tris(carbazol-9-yl)-triphenylamine (TCTA), 1,3,5-tris(N-phenyl benzimidazole-2-yl)benzene (TPBi), 3-tert-butyl-9,10-di(naphth-2-yl) anthracene (TBADN), distyrylarylene (DSA), 4,4'-bis(9-carbazolyl)-2,2"-dimethyl-biphenyl (CDBP), or 2-methyl-9, 10-bis(naphthalen-2-yl)anthracene (MADN) may be used as the host.

For example, each of the first, second, and third light-emitting layers EML1, EML2, and EML3, which emit blue light, may include a fluorescent material containing one selected from the group consisting of spiro-DPVBi, spiro-6P, distyryl-benzene (DSB), DSA, a polyfluorene (PFO) polymer, and a poly(p-phenylene vinylene) (PPV) polymer. In another example, each of the first, second, and third light-emitting layers EML1, EML2, and EML3 may include a phosphorescent material containing an organometallic complex such as (4,6-F2ppy)2Irpic.

As already mentioned above, at least one of the first, second, and third light-emitting layers EML1, EML2, and EML3 may emit blue light having a different wavelength range from the other light-emitting layer(s). In order to emit blue light of different wavelength ranges, the first, second, and third light-emitting layers EML1, EML2, and EML3 may be formed of the same material, but the resonance distances of the first, second, and third light-emitting layers EML1, EML2, and EML3 may be controlled (e.g., to be different from each other). Alternatively, in order to emit blue light of different wavelength ranges, at least one of the first, second, and third light-emitting layers EML1, EML2, and EML3 may include a different material from the other light-emitting layer(s).

In other embodiments, one of the first, second, and third light-emitting layers EML1, EML2, and EML3 may emit the first blue light having the first peak wavelength, another one of the first, second, and third light-emitting layers EML1, EML2, and EML3 may emit the second blue light having the second peak wavelength, which is different from the first peak wavelength, and the other (e.g., the remaining) light-emitting layer may emit the third blue light having the third peak wavelength, which is different from the first and second peak wavelengths. In the other embodiments, one of the first, second, and third peak wavelengths may range from about 440 nm to about 460 nm, another one of the first, second, and third peak wavelengths may range from about 460 nm to about 470 nm, and the other (e.g., the remaining) peak wavelength may range from about 470 nm to about 480 nm.

In the other embodiments, the emitted light L1, which is emitted from the light-emitting layer OL, is blue light and includes long-, mid-, and short-wavelength components. Thus, the light-emitting layer OL can emit blue light having a broad range of emission peaks as the emitted light L1. As a result, color visibility at a side viewing angle can be improved as compared to conventional light-emitting elements that emit blue light having sharp emission peaks.

According to the other embodiments, optical efficiency can be improved, and a long life (e.g., a long lifespan) can be realized, as compared to conventional light-emitting elements that do not employ a tandem structure in which a plurality of light-emitting layers are stacked.

In the other embodiments, the material of the first, second, and third light-emitting layers EML1, EML2, and EML3 may be the same as already described above, and thus, a detailed description thereof will be omitted.

In yet other embodiments, at least one of the first, second, and third light-emitting layers EML1, EML2, and EML3 may emit light of the first color, e.g., blue light, and the other light-emitting layer(s) may emit light of the third color, e.g., green light. Here, the peak wavelength of blue light emitted by the at least one of the first, second, and third light-emitting layers EML1, EML2, and EML3 may range from about 440 nm to about 480 nm or from about 460 nm to about 480 nm, and the peak wavelength of green light emitted by the other light-emitting layer(s) may range from about 510 nm to about 550 nm.

For example, one of the first, second, and third light-emitting layers EML1, EML2, and EML3 may be a green light-emitting layer, and the other two light-emitting layers may be blue light-emitting layers. In a case where two of the first, second, and third light-emitting layers EML1, EML2, and EML3 are blue-light emitting layers, blue light emitted by the blue-light emitting layers may have the same peak wavelength range or different wavelength ranges. In another example, two of the first, second, and third light-emitting layers EML1, EML2, and EML3 may be green light-emitting layers, and the other light-emitting layer may be a blue light-emitting layer.

In the yet other embodiments, the emitted light L1, which is emitted from the light-emitting layer OL, may be the mixture of the first component L11, i.e., blue light, and the second component L12, i.e., green light. For example, in a case where the first component L11 is deep blue light and the second component L12 is green light, the emitted light L1 may be sky blue light. In the yet other embodiments, like in (e.g., similar to) some of the above-described embodiments, the emitted light L1 is the mixture of blue light and green light and includes long- and short-wavelength components. Thus, the light-emitting layer OL can emit blue light having a broad range of emission peaks as the emitted light L1. As a result, color visibility at a side viewing angle can be improved as compared to conventional light-emitting elements that emit blue light having sharp emission peaks. Also, because the second component L12 of the emitted light L1 is green light, the green light component of light provided to the outside of the display device 1 can be properly compensated for, and as a result, the color reproducibility of the display device 1 can be improved.

In the yet other embodiments, the layer(s) from among the first, second, and third light-emitting layers EML1, EML2, and EML3 that is/are green light-emitting layers may include a host and a dopant, and the material of the host of the green light-emitting layers is not particularly limited. For example, Alq3, CBP, PVK, ADN, TCTA, TPBi, TBADN, DSA, CDBP, or MADN may be used as the host of the green light-emitting layers.

For example, the dopant of the green light-emitting layers may be a fluorescent material containing Alq3 or a phosphorescent material such as Ir(ppy)3(fac-tris(2-phenylpyridine)iridium), Ir(ppy)2(acac)(bis(2-phenylpyridine)(acetylacetonate)iridium(III)), or Ir(mpyp)3(2-phenyl-4-methylpyridine iridium).

The first charge generating layer CGL1 may be disposed between the first and second stacks ST1 and ST2. The first charge generating layer CGL1 injects charges into the first, second, and third light-emitting layers EML1, EML2, and EML3. The first charge generating layer CGL1 controls the charge balance between the first and second stacks ST1 and ST2. The first charge generating layer CGL1 may include an n-type charge generating layer CGL11 and a p-type charge generating layer CGL12. The p-type charge generating layer CGL12 may be disposed on the n-type charge generating layer CGL11, and between the n-type charge generating layer CGL11 and the second stack ST2.

The first charge generating layer CGL1 may have a structure in which the n-type charge generating layer CGL11 and the p-type charge generating layer CGL12 are bonded together. The n-type charge generating layer CGL11 is disposed to be closer to the first, second, and third anode electrodes AE1, AE2, and AE3 than to the cathode electrode CE. The p-type charge generating layer CGL12 is disposed to be closer to the first, second, and third anode electrodes AE1, AE2, and AE3 than to the cathode electrode CE. The n-type charge generating layer CGL11 provides electrons to the first light-emitting layer EML1, which is adjacent to the first, second, and third anode electrodes AE1, AE2, and AE3, and the p-type charge generating layer CGL12 provides holes to the second light-emitting layer EML2, which is included in the second stack ST2. The first charge-generating layer CGL1 is disposed between the first and second stacks ST1 and ST2 and provides charges to the first, second, and third light-emitting layers EML1, EML2, and EML3, thereby improving emission efficiency and lowering a driving voltage.

The first stack ST1 may be disposed on the first, second, and third anode electrodes AE1, AE2, and AE3, and may further include a first hole transport layer HTL1, a first electron block layer BIL1, and a first electron transport layer ETL1.

The first hole transport layer HTL1 may be disposed on the first, second, and third anode electrodes AE1, AE2, and AE3. The first hole transport layer HTL1 facilitates the transport of holes and may include a hole transport material. The hole transport material may include a carbazole-based derivative (such as N-phenylcarbazole or polyvinylcarbazole), a fluorene-based derivative, a triphenylamine-based derivative (such as N,N'-bis(3-methylphenyl)-N,N'-diphenyl-[1,1-biphenyl]-4,4'-diamine (TPD) or TCTA), N,N'-di (1-naphthyl)-N,N'-diphenylbenzidine (NPB), or 4,4'-cyclohexylidene bis[N,N-bis(4-methylphenyl)benzenamine] (TAPC), but the present disclosure is not limited thereto. In some embodiments, the first hole transport layer HTL1 may be formed as a single layer. Alternatively, in other embodiments, the first hole transport layer HTL1 may be formed as multiple layers, in which case, the multiple layers may include different materials.

The first electron block layer BIL1 may be disposed on the first hole transport layer HTL1, and between the first hole transport layer HTL1 and the first light-emitting layer EML1. The first electron block layer BIL1 may include a hole transport material and a metal or a metal oxide to prevent or substantially prevent electrons generated in the first light-emitting layer EML1 from infiltrating into the first hole transport layer HTL1. In some embodiments, the first hole transport layer HTI1 and the first electron block layer BIL1 may each be formed as a single layer, but the present disclosure is not limited thereto. In other embodiments, the first electron block layer BIL1 may not be provided.

The first electron transport layer ETL1 may be disposed on the first light-emitting layer EML1, and between the first charge generating layer CGL1 and the first light-emitting layer EML1. In some embodiments, the first electron transport layer ETL1 may include an electron transport material such as Alq3, TPBi, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), ADN, or a mixture thereof, but the present disclosure is not limited thereto. In some embodiments, the first electron transport layer ETL1 may be formed as a single layer. In other embodiments, the first electron transport layer ETL1 may be formed as multiple layers, in which case, the multiple layers may include different materials.

The second stack ST2 may be disposed on the first charge generating layer CGL1 and may further include a second hole transport layer HTL2, a second electron block layer BIL2, and a second electron transport layer ETL1.

The second hole transport layer HTL2 may be disposed on the first charge generating layer CGL1. The second hole transport layer HTL2 may be formed of the same material as the first hole transport layer HTL1 or may include at least one selected from among the above-described exemplary materials that can be included in the first hole transport layer HTL1. The second hole transport layer HTL2 may be formed as a single layer. Alternatively, the second hole transport layer HTL2 may be formed as multiple layers, in which case, the multiple layers may include different materials.

The second electron block layer BIL2 may be disposed on the second hole transport layer HTL2, and between the second hole transport layer HTL2 and the first light-emitting layer EML2. The second electron block layer BIL2 may be formed of the same material and the same structure as the first electron block layer BIL1 or may include at least one selected from among the above-described exemplary materials that can be included in the first electron block layer BIL1. In some embodiments, the second electron block layer BIL1 may not be provided.

The second electron transport layer ETL2 may be disposed on the second light-emitting layer EML2, and between the second charge generating layer CGL2 and the second light-emitting layer EML2. The second electron transport layer ETL2 may be formed of the same material and the same structure as the first electron transport layer ETL1 or may include at least one selected from among the above-described exemplary materials that can be included in the first electron transport layer ETL1. The second electron transport layer ETL2 may be formed as a single layer. Alternatively, the second electron transport layer ETL2 may be formed as multiple layers, in which case, the multiple layers may include different materials.

The second charge generating layer CGL2 may be disposed on the second stack ST2, and between the second and third stacks ST2 and ST3.

The second charge generating layer CGL2 may have the same structure as the first charge generating layer CGL1. For example, the second charge generating layer CGL2 may include an n-type charge generating layer CGL21 which is disposed adjacent to the second stack ST2 and a p-type charge generating layer CGL22 which is disposed adjacent to the cathode electrode CE. The p-type charge generating layer CGL22 may be disposed on the n-type charge generating layer CGL21.

The second charge generating layer CGL2 may have a structure in which the n-type charge generating layer CGL21 and the p-type charge generating layer CGL12 are bonded together. The first and second charge generating layers CGL1 and CGL2 may be formed of different materials or may be formed of the same material.

The second stack ST2 may be disposed on the second charge generating layer CGL2 and may further include a third hole transport layer HTL3 and a third electron transport layer ETL3.

The third hole transport layer HTL3 may be disposed on the second charge generating layer CGL2. The third hole transport layer HTL3 may be formed of the same material as the first hole transport layer HTL1 or may include at least one selected from among the above-described exemplary materials that can be included in the first hole transport layer HTL1. The third hole transport layer HTL3 may be formed as a single layer. Alternatively, the third hole transport layer HTL3 may be formed as multiple layers, in which case, the multiple layers may include different materials.

The third electron transport layer ETL3 may be disposed on the third light-emitting layer EML3, and between the cathode electrode CE and the third light-emitting layer EML3. The third electron transport layer ETL3 may be formed of the same material and the same structure as the first electron transport layer ETL1 or may include at least one selected from among the above-described exemplary materials that can be included in the first electron transport layer ETL1. The third electron transport layer ETL3 may be formed as a single layer. Alternatively, the third electron transport layer ETL3 may be formed as multiple layers, in which case, the multiple layers may include different materials.

In one embodiment, a hole injection layer (HIL) may be further disposed between the first stack ST1 and the first anode electrode AE1, between the second stack ST2 and the first charge generating layer CGL1, and/or between the third stack ST3 and the second charge generating layer CGL2. The HIL may facilitate the injection of holes into the first, second, and third light-emitting layers EML1, EML2, and EML3. In some embodiments, the HIL may be formed of at least one selected from among copper phthalocyanine (CuPc), poly(3,4)-ethylenedioxythiophene (PEDOT), polyaniline (PANI), and N,N-dinaphthyl-N,N'-diphenyl benzidine (NPD), but the present disclosure is not limited thereto. In some embodiments, HILs may be disposed between the first stack ST1 and the first anode electrode AE1, between the second stack ST2 and the first charge generating layer CGL1, and between the third stack ST3 and the second charge generating layer CGL2.

In one embodiment, an electron injection layer (EIL) may be further disposed between the third electron transport layer ETL3 and the cathode electrode CE, between the second charge generating layer CGL2 and the second stack ST2, and/or between the first charge generating layer CGL1 and the first stack ST1. The EIL may facilitate the injection of electrons and may include Alq3, PBD, TAZ, spiro-PBD, BAlq, or SAlq, but the present disclosure is not limited thereto. Also, the EIL may include a metal halide compound and may include, for example, at least one selected from the group consisting of $MgF_2$, LiF, NaF, KF, RbF, CsF, FrF, LiI, NaI, KI, RbI, CsI, FrI, and $CaF_2$, but the present disclosure is not limited thereto. Also, the EIL may include a lanthanide material such as Yb, Sm, or Eu. Also, the EIL may include both a metal halide material and a lanthanide material (e.g., RbI:Yb or KI:Yb), in which case, the EIL may be formed by codepositing the metal halide material and the lanthanide material. In some embodiments, the EILs may be disposed between the third electron transport layer ETL3 and the cathode electrode CE, between the second charge generating layer CGL2 and the second stack ST2, and between the first charge generating layer CGL1 and the first stack ST1.

The structure of the light-emitting layer OL may suitably vary. For example, the light-emitting layer OL may be modified into a light-emitting layer OLa of FIG. 7. The light-emitting layer OLa of FIG. 7, unlike the light-emitting layer OL of FIG. 6, may further include a fourth stack ST4 and a third charge generating layer CGL3, which are disposed between the third stack ST3 and the second stack ST2.

The fourth stack ST4 may include a fourth light-emitting layer EML4 and may further include a fourth hole transport layer HTL4, a third electron block layer BIL3, and a fourth electron transport layer ETL4.

The first, second, third, and fourth light-emitting layer EML1, EML2, EML3, and EML4 may emit light of the first color, e.g., blue light. At least one of the first, second, third, and fourth light-emitting layer EML1, EML2, EML3, and EML4 and at least one other of the first, second, third, and fourth light-emitting layer EML1, EML2, EML3, and EML4 may emit blue light of different peak wavelength ranges.

Alternatively, at least one of the first, second, third, and fourth light-emitting layer EML1, EML2, EML3, and EML4 may emit green light, and at least one other of the first, second, third, and fourth light-emitting layer EML1, EML2, EML3, and EML4 may emit blue light.

The fourth hole transport layer HTL4 may be disposed on the second charge generating layer CGL2. The fourth hole transport layer HTL4 may be formed of the same material as the first hole transport layer HTL1 or may include at least one selected from among the above-described exemplary materials that can be included in the first hole transport layer HTL1. The fourth hole transport layer HTL4 may be formed as a single layer. Alternatively, the fourth hole transport layer HTL4 may be formed as multiple layers, in which case, the multiple layers may include different materials.

The third electron block layer BIL3 may be disposed on the fourth hole transport layer HTL4, and between the fourth hole transport layer HTL4 and the fourth light-emitting layer EML4. The third electron block layer BIL3 may be formed of the same material and the same structure as the first electron block layer BIL1 or may include at least one selected from among the above-described exemplary materials that can be included in the first electron block layer BIL1. In some embodiments, the third electron block layer BIL3 may not be provided.

The fourth electron transport layer ETL4 may be disposed on the fourth light-emitting layer EML4, and between the third charge generating layer CGL3 and the fourth light-emitting layer EML4. The fourth electron transport layer ETL4 may be formed of the same material and the same structure as the first electron transport layer ETL1 or may include at least one selected from among the above-described exemplary materials that can be included in the first electron transport layer ETL1. The fourth electron transport layer ETL4 may be formed as a single layer. Alternatively, the fourth electron transport layer ETL4 may be formed as multiple layers, in which case, the multiple layers may include different materials.

The third charge generating layer CGL3 may have the same structure as the first charge generating layer CGL1. For example, the third charge generating layer CGL3 may include an n-type charge generating layer CGL31 which is disposed adjacent to the second stack ST2 and a p-type charge generating layer CGL32 which is disposed adjacent to the cathode electrode CE. The p-type charge generating layer CGL32 may be disposed on the n-type charge generating layer CGL31.

In one embodiment, an EIL may be further disposed between the fourth stack ST4 and the third charge generating layer CGL3, and an HIL may be further disposed between the fourth stack ST4 and the second charge generating layer CGL2.

Both the light-emitting layer OL of FIG. 6 and the light-emitting layer OLa of FIG. 7 may not include red light-emitting layers and thus may not emit light of the second color, e.g., red light. That is, the emitted light L1 may not include any components having a peak wavelength of about 610 nm to about 650 nm.

As illustrated in FIGS. 5 through 9, a thin-film encapsulation layer 170 is disposed on the cathode electrode CE. The thin-film encapsulation layer 170 is disposed in common in the first, second, and third light-emitting areas LA1, LA2, and LA3 and in the non-light-emitting area NLA. In some embodiments, the thin-film encapsulation layer 170 may directly cover the cathode electrode CE. In some embodiments, a capping layer which covers the cathode electrode CE may be further disposed between the thin-film encapsulation layer 170 and the cathode electrode CE, in which case, the thin-film encapsulation layer 170 may directly cover the capping layer.

In some embodiments, the thin-film encapsulation layer 170 may include a first encapsulation inorganic film 171, an encapsulation organic film 173, and a second encapsulation inorganic film 175 which are sequentially stacked on the cathode electrode CE.

In some embodiments, the first and second encapsulation inorganic films 171 and 175 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

In some embodiments, the encapsulation organic film 173 may be formed of an acrylic resin, a methacrylic resin, polyisoprene, a vinyl resin, an epoxy resin, a urethane resin, a cellulose resin, or a perylene resin.

The structure of the thin-film encapsulation layer 170 is not particularly limited and may suitably vary.

A panel light-shielding member 190 may be disposed on the thin-film encapsulation layer 170. The panel light-shielding member 190 may be disposed on the thin-film encapsulation layer 170 and may be located in the non-light-emitting area NLA. The panel light-shielding member 190 may prevent or reduce the infiltration of light between adjacent light-emitting areas to prevent or reduce color mixing, and as a result, color reproducibility can be further improved.

In some embodiments, the panel light-shielding member 190 may be located in the non-light-emitting area NLA and may be disposed to surround the light-emitting areas (LA1, LA2, LA3, LA4, LA5, and LA6) in a plan view.

The panel light-shielding member 190 may include an organic light-shielding material and may be formed by coating the organic light-shielding material and subjecting the organic light-shielding material to exposure (e.g., exposure to light).

The color conversion substrate 30 will hereinafter be described with reference to FIGS. 12 through 15 and again to FIGS. 5 through 11.

Figure 14:
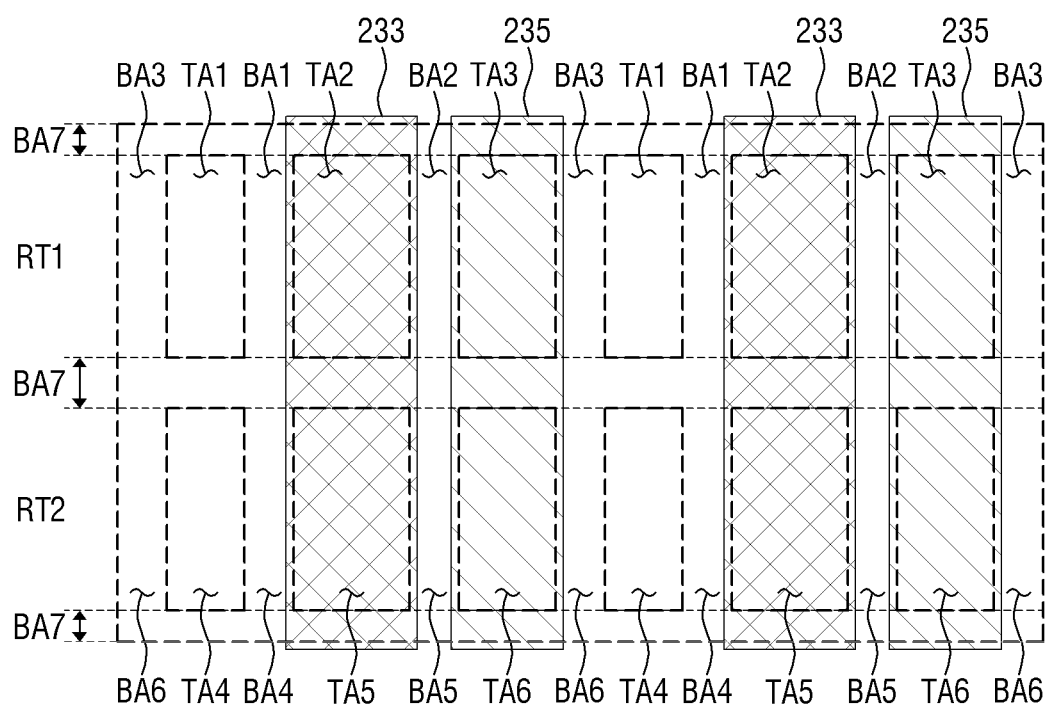
FIG. 14 is a plan view illustrating the arrangement of second color filters and third color filters in the color conversion substrate of the display device of FIG. 1.
Figure 15:
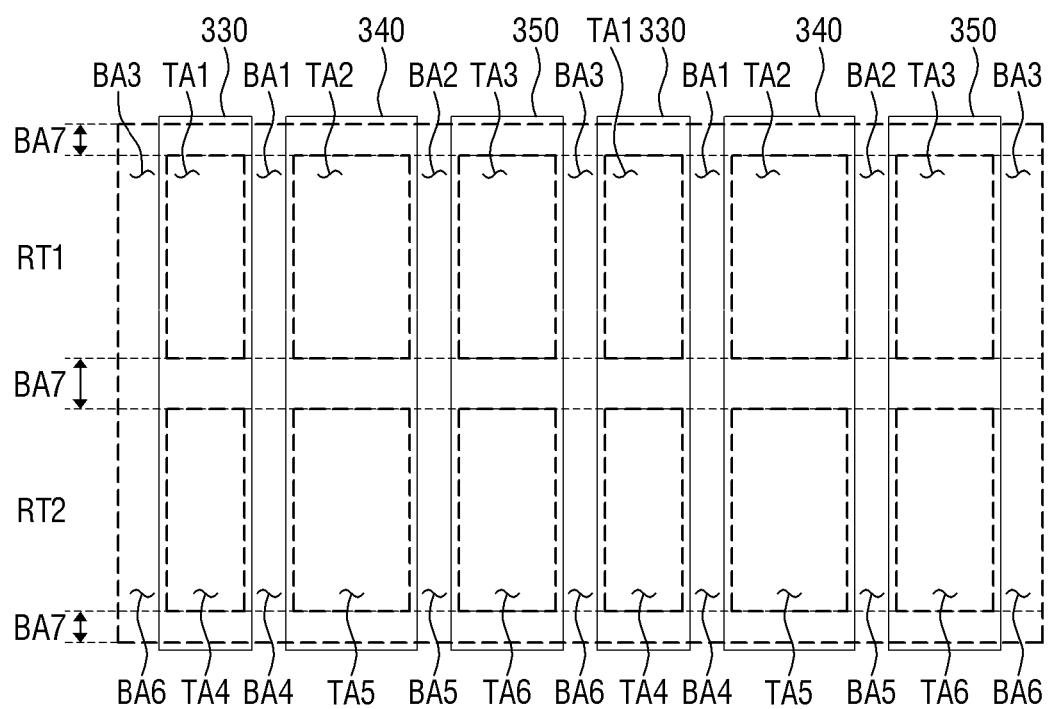
FIG. 15 is a plan view illustrating the arrangement of first wavelength conversion patterns, second wavelength conversion patterns, and light-transmitting patterns in the color conversion substrate of the display device of FIG. 1.

FIG. 12 is a plan view illustrating the arrangement of first color filters and color patterns in the color conversion substrate of the display device of FIG. 1, FIG. 13 is a plan view illustrating the arrangement of a light-shielding member in the color conversion substrate of the display device of FIG. 1, FIG. 14 is a plan view illustrating the arrangement of second color filters and third color filters in the color conversion substrate of the display device of FIG. 1, and FIG. 15 is a plan view illustrating the arrangement of first wavelength conversion patterns, second wavelength conversion patterns, and light-transmitting patterns in the color conversion substrate of the display device of FIG. 1.

Referring to FIGS. 5 through 15, a second base member 310 may be formed of a material having transparency. In some embodiments, the second base member 310 may be a glass substrate or a plastic substrate. In a case where the second base member 310 is a plastic substrate, the second base member 310 may have flexibility. In some embodiments, the second base member 310 may include a glass or plastic substrate, and may further include a separate layer, e.g., a buffer layer or an insulating layer, which is disposed on the glass or plastic substrate.

In some embodiments, as already mentioned above, the light-transmitting areas (TA1, TA2, TA3, TA4, TA5, and TA6) and the light-blocking area BA may be defined on the second base member 310.

Referring to FIGS. 5 and 8 through 12, first color filters 231 and color patterns 250 may be disposed on a first surface of the second base member 310 that faces the display substrate 10.

The first color filters 231 may be disposed on the first surface of the second base member 310 and may be located in first light-transmitting areas TA1 and fourth light-transmitting areas TA4. In some embodiments, first color filters 231 in the first light-transmitting areas TA1 and first color filters 231 in the fourth light-transmitting areas TA4 may be isolated from one another in the second direction D2. In some embodiments, seventh color patterns 257 may be disposed between the first color filters 231 in the first light-transmitting areas TA1 and the first color filters 231 in the fourth light-transmitting areas TA4. The seventh color patterns 237 may be connected to the first color filters 231.

The first color filters 231 may selectively transmit light of the first color (e.g., blue light) therethrough and may block or absorb light of the second color (e.g., red light) and light of the third color (e.g., green light). In some embodiments, the first color filters 231 may be blue color filters and may include a blue colorant such as a blue dye or pigment. The term "colorant", as used herein, encompasses both a dye and a pigment.

In a display device, most of the external light is reflected, which causes distortion of the color reproducibility of the color conversion substrate 30. However, in a case where the color patterns 250 are disposed on the second base member 310 according to embodiments of the present disclosure, the color patterns 250 may absorb some of the external light introduced into the color conversion substrate 30 from the outside of the display device 1 and may thus reduce the amount of reflected light of the external light. Therefore, the distortion of colors by the external light may be reduced.

In some embodiments, the color patterns 250 may include a blue colorant such as a blue dye or pigment. In some embodiments, the color patterns 250 may be formed of the same material as the first color filters 231 and may be formed during the formation of the first color filters 231. That is, the first color filters 231 and the color patterns 250 may be formed concurrently (e.g., at the same time) by applying a photosensitive organic material including a blue colorant on the first surface of the second base member 310 and subjecting the photosensitive organic material to exposure and development.

In some embodiments, a thickness TH2, in the third direction D3, of the color patterns 250 may be substantially the same as a thickness TH1, in the third direction D3, of the first color filters 231. In a case where the color patterns 250 include a blue colorant, external light or reflected light passing through the color patterns 250 may have a blue wavelength range. The color sensitivity of eyes (e.g., a user's eyes) varies depending on the color of light. Specifically, light in the blue wavelength range may be perceived less sensitively than light in a green or red wavelength range. Thus, because the color patterns 250 include a blue colorant, a user can perceive reflected light less sensitively. That is, the reflected light is less perceptible to the user.

The color patterns 250 may be disposed on the first surface of the second base member 310 and may be located in the light-blocking area BA. Also, the color patterns 250 may be disposed to overlap with the non-light-emitting area NLA. In some embodiments, the color patterns 250 may be in direct contact with the first surface of the second base member 310. Also, in a case where a separate buffer layer is provided on the first surface of the second base member 310 to prevent or reduce the infiltration of impurities, the color patterns 250 may also be in direct contact with the buffer layer.

In some embodiments, the color patterns 250 may be disposed in the entire light-blocking area BA. In some embodiments, the color patterns 250 may include first color patterns 251 which are disposed in first light-blocking areas BA1, second color patterns 252 which are disposed in second light-blocking areas BA2, third color patterns 253 which are disposed in third light-blocking areas BA3, fourth color patterns 254 which are disposed in fourth light-blocking areas BA4, fifth color patterns 255 which are disposed in fifth light-blocking areas BA5, sixth color patterns 256 which are disposed in sixth light-blocking areas BA6, and the seventh color patterns 257 which are disposed in seventh light-blocking areas BA7. In some embodiments, the seventh color patterns 257 may be connected to the first color patterns 251, the second color patterns 252, the third color patterns 253, the fourth color patterns 254, the fifth color patterns 255, and the sixth color patterns 256.

Also, the color patterns 250 may be connected to the first color filters 231.

As illustrated in FIGS. 5, 8 through 11, and 13, the light-shielding members 220 may be disposed on the first surface of the second base member 310, which faces the display substrate 10. The light-shielding members 220 may be disposed in the light-blocking area BA and may block the transmission of light. In some embodiments, the light-shielding members 220 may be arranged in a substantially lattice structure in a plan view, as illustrated in FIG. 13.

In some embodiments, the light-shielding members 220 may include an organic light-shielding material and may be formed by coating the organic light-shielding material and subjecting the organic light-shielding material to exposure (e.g., exposure to light).

As already mentioned above, external light may distort the color reproducibility of the color conversion substrate 30. However, in a case where the light-shielding members 220 are disposed on the second base member 310, at least some external light can be absorbed by the light-shielding members 220. As a result, the distortion of colors by the reflection of external light can be reduced. In some embodiments, the light-shielding members 220 may prevent or reduce the infiltration of light between adjacent light-emitting areas to prevent or reduce color mixing, and as a result, color reproducibility can be further improved.

In some embodiments, the light-shielding members 220 may include first light-shielding members 221 which are disposed in the first light-blocking areas BA1, second light-shielding members 222 which are disposed in the second light-blocking areas BA2, third light-shielding members 223 which are disposed in the third light-blocking areas BA3, fourth light-shielding members 224 which are disposed in the fourth light-blocking areas BA4, fifth light-shielding members 225 which are disposed in the fifth light-blocking areas BA5, sixth light-shielding members 226 which are disposed in the sixth light-blocking areas BA6, and seventh light-shielding members 227 which are disposed in the seventh light-blocking areas BA7. In some embodiments, the first light-shielding members 221, the second light-shielding members 222, and the third light-shielding members 223 may be connected to the seventh light-shielding members 227, and the fourth light-shielding members 224, the fifth light-shielding members 225, and the sixth light-shielding members 226 may also be connected to the seventh light-shielding members 227.

The light-shielding members 220 may be disposed on the color patterns 250. In some embodiments, the first light-shielding members 221 may be disposed on the first color patterns 251, the second light-shielding members 222 may be disposed on the second color patterns 252, the third light-shielding members 223 may be disposed on the third color patterns 253, the fourth light-shielding members 224 may be disposed on the fourth color patterns 254, the fifth light-shielding members 225 may be disposed on the fifth color patterns 255, the sixth light-shielding members 226 may be disposed on the sixth color patterns 256, and the seventh light-shielding members 227 may be disposed on the seventh color patterns 257.

The color patterns 250 are disposed between the light-shielding members 220 and the second base member 310, and thus, in some embodiments, the light-shielding members 220 may not be in contact with the second base member 310.

As illustrated in FIGS. 5, 8 through 11, and 14, the second color filters 233 and the third color filters 235 may be disposed on the first surface of the second base member 310, which faces the display substrate 10.

The second color filters 233 may be disposed in the second light-transmitting areas TA2 and the fifth light-transmitting areas TA5, and the third color filters 235 may be disposed in the third light-transmitting areas TA3 and the sixth light-transmitting areas TA6.

As illustrated in FIG. 5, in some embodiments, first sides of the second color filters 233 may be located in the first light-blocking areas BA1 and may be disposed on the first color patterns 251 and the first light-shielding members 221. Also, in some embodiments, second sides of the second color filters 233 may be located in the second light-blocking areas BA2 and may be disposed on the second color patterns 252 and the second light-shielding members 222.

As illustrated in FIG. 5, in some embodiments, first sides of the third color filters 235 may be located in the second light-blocking areas BA2 and may be disposed on the second color patterns 252 and the second light-shielding members 222. Also, in some embodiments, second sides of the third color filters 235 may be located in the third light-blocking areas BA3 and may be disposed on the third color patterns 253 and the third light-shielding members 223.

As illustrated in FIG. 14, in some embodiments, the second color filters 233 and the third color filters 235 may be arranged as stripes extending in the second direction D2 and may extend across the seventh light-blocking areas BA7 between the first and second rows RT1 and RT2. Thus, in the seventh light-blocking areas BA7, the second color filters 233 and the third color filters 235 may be disposed on the seventh light-shielding members 227, and may cover the seventh color patterns 257 and the seventh light-shielding members 227, respectively, along the second direction D2, but the present disclosure is not limited thereto. In other embodiments, the second color filters 233 and/or the third color filters 235 may be formed as island patterns isolated in the second direction D2.

The second color filters 233 may block or absorb light of the first color (e.g., blue light). That is, the second color filters 233 may serve as blue light filters capable of blocking blue light. In some embodiments, the second color filters 233 may selectively transmit light of the second color (e.g., red light) therethrough and may block or absorb light of the first color (e.g., blue light) and light of the third color (e.g., green light). For example, the second color filters 233 may be red color filters and may include a red colorant such as a red dye or pigment.

The third color filters 235 may block or absorb light of the first color (e.g., blue light). That is, the third color filters 235 may also serve as blue light filters. In some embodiments, the third color filters 235 may selectively transmit light of the third color (e.g., green light) therethrough and may block or absorb light of the first color (e.g., blue light) and light of the second color (e.g., red light). For example, the third color filters 235 may be green color filters and may include a green colorant such as a green dye or pigment.

As illustrated in FIGS. 5 and 8 through 11, a first capping layer 391 which covers the light-shielding members 220, the color patterns 250, the first color filters 231, the second color filters 233, and the third color filters 235 may be disposed on the first surface of the second base member 310. In some embodiments, the first capping layer 391 may be in direct contact with the first color filters 231, the second color filters 233, and the third color filters 235.

The first capping layer 391 may be further in contact with the light-shielding members 220. For example, as illustrated in FIG. 5, in the first light-blocking areas BA1, the first light-shielding members 221 may be in direct contact with the first capping layer 391, in the second light-blocking areas BA2, the second light-shielding members 222 may be in direct contact with the first capping layer 391, and in the third light-blocking areas BA3, the third light-shielding members 223 may be in direct contact with the first capping layer 391. Also, as illustrated in FIG. 8, in the seventh light-blocking areas BA7, the seventh light-shielding members 227 may also be in contact with the first capping layer 391.

The first capping layer 391 may prevent or substantially prevent the light-shielding members 220, the color patterns 250, the first color filters 231, the second color filters 233, and the third color filters 235 from being damaged or polluted by moisture or air infiltrated from the outside of the display device 1. Also, the first capping layer 391 may prevent or substantially prevent the colorants of the first color filters 231, the second color filters 233, and the third color filters 235 from diffusing to other elements, e.g., first wavelength conversion patterns 340 and second wavelength conversion patterns 350. In some embodiments, the first capping layer 391 may be formed of an inorganic material. For example, the first capping layer 391 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

As illustrated in FIGS. 5, 8 through 11, and 15, light-transmitting patterns 330, the first wavelength conversion patterns 340, and the second wavelength conversion patterns 350 may be disposed on the first capping layer 391.

In some embodiments, the light-transmitting patterns 330, the first wavelength conversion patterns 340, and the second wavelength conversion patterns 350 may be formed by applying a photosensitive material and subjecting the photosensitive material to exposure and development, but the present disclosure is not limited thereto. In other embodiments, the light-transmitting patterns 330, the first wavelength conversion patterns 340, and the second wavelength conversion patterns 350 may be formed by inkjet printing.

The light-transmitting patterns 330 may be disposed on the first capping layer 391 and may be located in the first light-transmitting areas TA1 and the fourth light-transmitting areas TA4. In some embodiments, as illustrated in FIG. 15, the light-transmitting patterns 330 may be formed as stripes extending in the second direction D2 and may extend across the seventh light-blocking areas BA7 between the first and second rows RT1 and RT2, but the present disclosure is not limited thereto. In other embodiments, the light-transmitting patterns 330 may be formed as, for example, island patterns, so that light-transmitting patterns 330 in the first light-transmitting areas TA1 can be isolated from light-transmitting patterns 330 in the fourth light-transmitting areas TA4.

The light-transmitting patterns 330 may transmit incident light therethrough. As already mentioned above, emitted light L1 provided by the first light-emitting element ED1 may be the mixture of sky blue light and deep blue light or the mixture of blue light and green light. A component of the emitted light L1 in the blue wavelength range may penetrate (e.g., pass through) the light-transmitting patterns 330 and the first color filters 231 and may then be emitted out of the display device 1. That is, first light La which is emitted from the first light-transmitting areas TA1 may be blue light.

In some embodiments, each of the light-transmitting patterns may include a first base resin 331 and a first scatterer 333 which is dispersed in the first base resin 331.

The first base resin 331 may be formed of a material with a high light transmittance. In some embodiments, the first base resin 331 may be formed of an organic material. For example, the first base resin 331 may include an epoxy resin, an acrylic resin, a cardo resin, or an imide resin.

The first scatterer 333 may have a different refractive index from the first base resin 331 and may form an optical interface with the first base resin 331. For example, the first scatterer 333 may be light-scattering particles. The material of the first scatterer 333 is not particularly limited as long as it can scatter at least some light passing through the light-transmitting patterns 330. For example, the first scatterer 333 may include metal oxide particles or organic particles. The metal oxide particles may be, for example, particles of titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic particles may be, for example, particles of an acrylic resin or a urethane resin. The first scatterer 333 can scatter light in random directions regardless of the incidence direction of the light without substantially changing the wavelength of light passing through the light-transmitting patterns 330.

The first wavelength conversion patterns 340 may be disposed on the first capping layer 391 and may be located in the second light-transmitting areas TA2 and the fifth light-transmitting areas TA5. In some embodiments, as illustrated in FIG. 15, the first wavelength conversion patterns 340 may be formed as stripes extending in the second direction D2 and may extend across the seventh light-blocking areas BA7 between the first and second rows RT1 and RT2, but the present disclosure is not limited thereto. In other embodiments, the first wavelength conversion patterns 340 may be formed as, for example, island patterns, so that first wavelength conversion patterns 340 in the second light-transmitting areas TA2 can be isolated from first wavelength conversion patterns 340 in the fifth light-transmitting areas TA5.

The first wavelength conversion patterns 340 may convert or shift the peak wavelength of incident light into a set or predetermined peak wavelength. In some embodiments, the first wavelength conversion patterns 340 may convert emitted light L1 provided by the second light-emitting element ED2 into red light having a peak wavelength of about 610 nm to about 650 nm.

In some embodiments, each of the first wavelength conversion patterns 340 may include a second base resin 341 and a first wavelength shifter 345 which is dispersed in the second base resin 341 and may further include a second scatterer 343 which is dispersed in the second base resin 341.

The second base resin 341 may be formed of a material with a high light transmittance. In some embodiments, the second base resin 341 may be formed of an organic material. In some embodiments, the second base resin 341 may be formed of the same material as the first base resin 331 or may include at least one of the above-described exemplary materials that can be included in the first base resin 331.

The first wavelength shifter 345 may convert or shift the peak wavelength of incident light into a set or predetermined peak wavelength. In some embodiments, the first wavelength shifter 345 may convert the emitted light L1 provided by the second light-emitting element ED2, e.g., blue light, into red light having a single peak wavelength of about 610 nm to about 650 nm.

Examples of the first wavelength shifter 345 include quantum dots, quantum rods, and a phosphor. For example, the quantum dots may be a particulate material that emits light of a particular color in response to the transition of the electrons from the conduction band to the valance band.

The quantum dots may be a semiconductor nanocrystal material. Because the quantum dots have a set or predetermined band gap depending on their composition and size, the quantum dots absorb light and emit light of a set or predetermined wavelength. The semiconductor nanocrystal material includes a group IV element, a group II-VI compound, a group III-V compound, a group IV-VI compound, and/or a combination thereof.

The group II-VI compound may be selected from the group consisting of: a binary compound selected from among CdSe, CdTe, ZnS, ZnSe, ZnTe, ZnO, HgS, HgSe, HgTe, MgSe, MgS, and a mixture thereof; a ternary compound selected from among InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compound selected from among GaN, GaP, GaAs, GaSb, AlN, AlP, AlAs, AlSb, InN, InP, InAs, InSb, and a mixture thereof; a ternary compound selected from among GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and a mixture thereof; and a quaternary compound selected from among GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from among SnS, SnSe, SnTe, PbS, PbSe, PbTe, and a mixture thereof; a ternary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof. The group IV element may be selected from the group consisting of Si, Ge, and a mixture thereof. The group IV compound may be a binary compound selected from among SiC, SiGe, and a mixture thereof.

These binary, ternary, or quaternary compounds may exist in a uniform concentration or in a partially different concentration throughout the particles. The quantum dots may have a core-shell structure in which one quantum dot surrounds another quantum dot. The interfaces between the cores and the shells of the quantum dots may have a concentration gradient in which the concentration of the element(s) in the shells of the quantum dots gradually decreases toward the centers of the shells of the quantum dots (e.g., from the interface between the cores and the shells).

In some embodiments, the quantum dots may have a core-shell structure including (e.g., consisting of) a core including the above-described semiconductor nanocrystal material and a shell surrounding the core. The shells of the quantum dots may serve as protective layers for maintaining the semiconductor characteristics of the quantum dots by preventing or reducing chemical denaturation of the cores of the quantum dots and/or as charging layers for imparting electrophoretic characteristics to the quantum dots. The shells of the quantum dots may have a single-layer structure or a multilayer structure. The interfaces between the cores and the shells of the quantum dots may have a concentration gradient in which the concentration of the element(s) at the shells of the quantum dots gradually decreases toward the centers of the shells of the quantum dots (e.g., from the interface between the cores and the shells). The shells of the quantum dots may include a metal or non-metal oxide, a semiconductor compound, or a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$, or a ternary compound such as $MgAl_2O_4$, $CoFe_2O_4$, $NiFe_2O_4$, or $CoMn_2O_4$, but the present disclosure is not limited thereto.

For example, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but the present disclosure is not limited thereto.

Light emitted by the first wavelength shifter 345 may have a full width at half maximum (FMHM) of about 45 nm or less, about 40 nm or less, or about 30 nm or less, and thus, the purity of colors displayed by the display device 1 and the color reproducibility of the display device 1 can be further improved. Also, the first wavelength shifter 345 can emit light in various directions regardless of the incidence direction of the light. The side visibility of the second color displayed in the second light-transmitting areas TA2 can be improved.

Some of the emitted light L1 provided by the second light-emitting element ED2 may be emitted as it passes through the first wavelength conversion patterns 340 without being converted into red light by the first wavelength shifter 345. A component of the emitted light L1 that is incident upon the second color filters 233 without being converted by the first wavelength conversion patterns 340 may be blocked by the second color filters 233. Red light obtained from the emitted light L1 by the first wavelength conversion patterns 340 may be emitted out of the display device 1 through the second color filters 233. That is, second light Lb emitted from the second light-transmitting areas TA2 may be red light.

The second scatterer 343 may have a different refractive index from the second base resin 341 and may form an optical interface with the first base resin 331. For example, the second scatterer 343 may include light-scattering particles. The second scatterer 343 is substantially the same as, or similar to, the first scatterer 333, and thus, a detailed description thereof will be omitted.

The second wavelength conversion patterns 350 may be disposed on the first capping layer 391 and may be located in the third light-transmitting areas TA3 and the sixth light-transmitting areas TA6. In some embodiments, as illustrated in FIG. 15, the second wavelength conversion patterns 350 may be formed as stripes extending in the second direction D2 and may extend across the seventh light-blocking areas BA7 between the first and second rows RT1 and RT2, but the present disclosure is not limited thereto. In other embodiments, the second wavelength conversion patterns 350 may be formed as, for example, island patterns, so that second wavelength conversion patterns 350 in the third light-transmitting areas TA3 can be isolated from second wavelength conversion patterns 350 in the sixth light-transmitting areas TA6.

The second wavelength conversion patterns 350 may convert or shift the peak wavelength of incident light into a set or predetermined peak wavelength. In some embodiments, the second wavelength conversion patterns 350 may convert emitted light L1 provided by the third light-emitting element ED3 into green light having a peak wavelength of about 510 nm to about 550 nm.

In some embodiments, each of the second wavelength conversion patterns 350 may include a third base resin 351 and a second wavelength shifter 355 which is dispersed in the third base resin 351 and may further include a third scatterer 353 which is dispersed in the third base resin 351.

The third base resin 351 may be formed of a material with a high light transmittance. In some embodiments, the third base resin 351 may be formed of an organic material. In some embodiments, the third base resin 351 may be formed of the same material as the first base resin 331 or may include at least one of the above-described exemplary materials that can be included in the first base resin 331.

The second wavelength shifter 355 may convert or shift the peak wavelength of incident light into a set or predetermined peak wavelength. In some embodiments, the second wavelength shifter 355 may convert blue light having a peak wavelength of about 440 nm to about 480 nm into green light having a single peak wavelength of about 510 nm to about 550 nm.

Examples of the second wavelength shifter 355 include quantum dots, quantum rods, and a phosphor. The second wavelength shifter 355 is substantially the same as, or similar to the first wavelength shifter 345, and thus, a detailed description thereof will be omitted.

In some embodiments, the first and second wavelength shifters 345 and 355 may both be formed as (e.g., formed of) quantum dots. In this case, the particle size of the first wavelength shifter 345 may be greater than the particle size of the second wavelength shifter 355.

The third scatterer 353 may have a different refractive index from the third base resin 351 and may form an optical interface with the third base resin 351. For example, the third scatterer 353 may include light-scattering particles. The third scatterer 353 is substantially the same as, or similar to, the second scatterer 343, and thus, a detailed description thereof will be omitted.

The emitted light L1 from the third light-emitting element ED3 may be provided to the second wavelength conversion patterns 350, and the second wavelength shifter 355 may convert the emitted light L1 into green light having a peak wavelength of about 510 nm to about 550 nm.

In a case where the emitted light L1 is blue light (or the mixture of deep blue light and sky blue light), some of the emitted light L1 may be emitted as it passes through the second wavelength conversion patterns 350 without being converted into red light by the second wavelength shifter 355 and may be blocked by the third color filters 235. Green light obtained from the emitted light L1 by the second wavelength conversion patterns 350 may be emitted out of the display device 1 through the third color filters 235. That is, third light Lc emitted from the third light-transmitting areas TA3 may be green light.

In a case where the emitted light L1 is the mixture of deep blue light and sky blue light, the emitted light L1 includes both long- and short-wavelength components, and thus, the moving path of emitted light L1 incident upon the second wavelength conversion patterns 350 can be elongated. As a result, the amount of emitted light L1 provided to the second wavelength shifter 355 can be increased, and the light conversion efficiency of the second wavelength conversion patterns 350 can also be increased. Accordingly, the color reproducibility of the display device 1 can be improved.

In some embodiments, the light conversion efficiency of the second wavelength conversion patterns 350, which convert blue light having a peak wavelength of about 440 nm to about 480 nm into green light, may be lower than the light conversion efficiency of the first wavelength conversion patterns 340, which convert blue light having a peak wavelength of about 440 nm to about 480 nm into red light. Thus, even if the same amount of blue light is provided to the first wavelength conversion patterns 340 and the second wavelength conversion patterns 350, the amount of third light Lc emitted from the third light-transmitting areas TA3 may be smaller than the amount of second light Lb emitted from the second light-transmitting areas TA2, and as a result, the color reproducibility of the display device 1 may be degraded.

In a case where the emitted light L1 is the mixture of blue light and green light, a green light component of the emitted light L1 may be emitted out of the third light-transmitting areas TA3 together with the third light Lc, which is green light obtained by the second wavelength conversion patterns 350. That is, a relatively small amount of green light can be compensated for by a green light component emitted from the third light-emitting element ED3, and as a result, the color reproducibility of the display device 1 can be improved.

As illustrated in FIGS. 5 and 8 through 11, a second capping layer 393 may be disposed on the light-transmitting patterns 330, the first wavelength conversion patterns 340, and the second wavelength conversion patterns 350. The second capping layer 393 may cover the light-transmitting patterns 330, the first wavelength conversion patterns 340, and the second wavelength conversion patterns 350. The second capping layer 393 may be in contact with the first capping layer 391 and may seal the light-transmitting patterns 330, the first wavelength conversion patterns 340, and the second wavelength conversion patterns 350. Accordingly, the light-transmitting patterns 330, the first wavelength conversion patterns 340, and the second wavelength conversion patterns 350 can be prevented or substantially prevented from being damaged or polluted by moisture or air infiltrated from the outside of the display device 1. In some embodiments, the second capping layer 393 may be formed of an inorganic material. In some embodiments, the second capping layer 393 may be formed of the same material as the first capping layer 391 or may include at least one selected from among the above-described exemplary materials that can be included in the first capping layer 391. In a case where the first and second capping layers 391 and 393 are both formed of an inorganic material, parts of the first and second capping layers 391 and 393 that are in direct contact with each other may be inorganic-inorganic bonded (e.g., the first and second capping layers 391 and 393 may form inorganic-inorganic bonds with each other) and can thus effectively prevent or reduce the infiltration of moisture or air from the outside.

As illustrated in FIGS. 5 and 11, the color mixing-preventing members 370 may be disposed on the second capping layer 393. The color mixing-preventing members 370 may be disposed in the light-blocking area BA and may block the transmission of light. Specifically, the color mixing-preventing members 370 may be disposed between the light-transmitting patterns 330 and the first wavelength conversion patterns 340 and between the first wavelength conversion patterns 340 and the second wavelength conversion patterns 350 to prevent or reduce color mixing between adjacent light-transmitting areas. In some embodiments, the color mixing-preventing members 370 may be formed as stripes extending in the second direction D2.

In some embodiments, the color mixing-preventing members 370 may include an organic light-shielding material and may be formed by coating the organic light-shielding material and subjecting the organic light-shielding material to exposure (e.g., exposure to light).

The filler member 70 may be disposed in the gap between the color conversion substrate 30 and the display substrate 10. In some embodiments, as illustrated in FIGS. 5 and 8 through 11, the filler member 70 may be disposed between the second capping layer 393 and the thin-film encapsulation layer 170 and between the color mixing-preventing members 370 and the thin-film encapsulation layer 170. In some embodiments, the filler member 70 may be in direct contact with the second capping layer 393 and the color mixing-preventing members 370.

Figure 16:
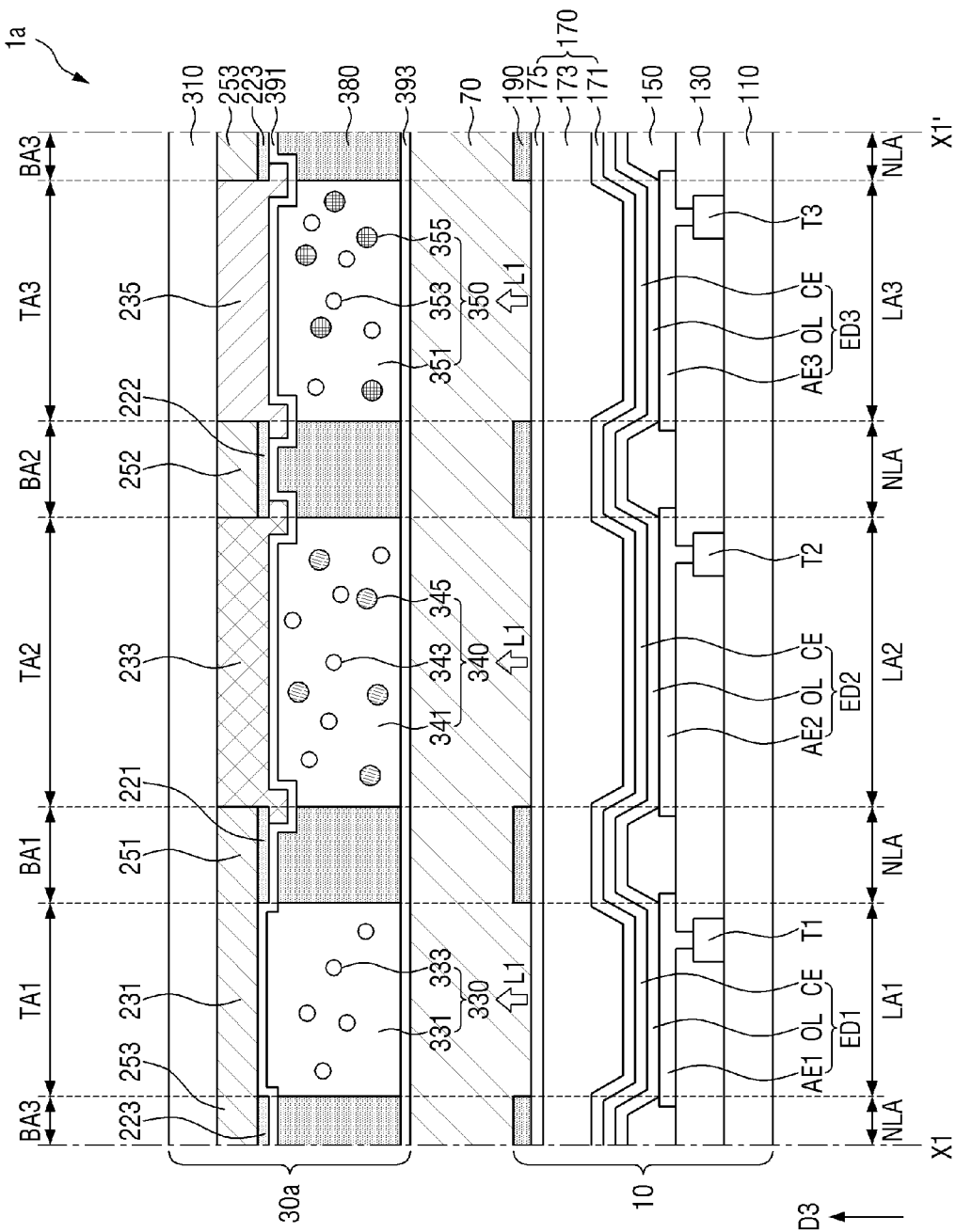
FIG. 16 is a cross-sectional view, taken along the line X1-X1' of FIG. 3 or 4, of a display device according to another embodiment of the present disclosure.
Figure 17:
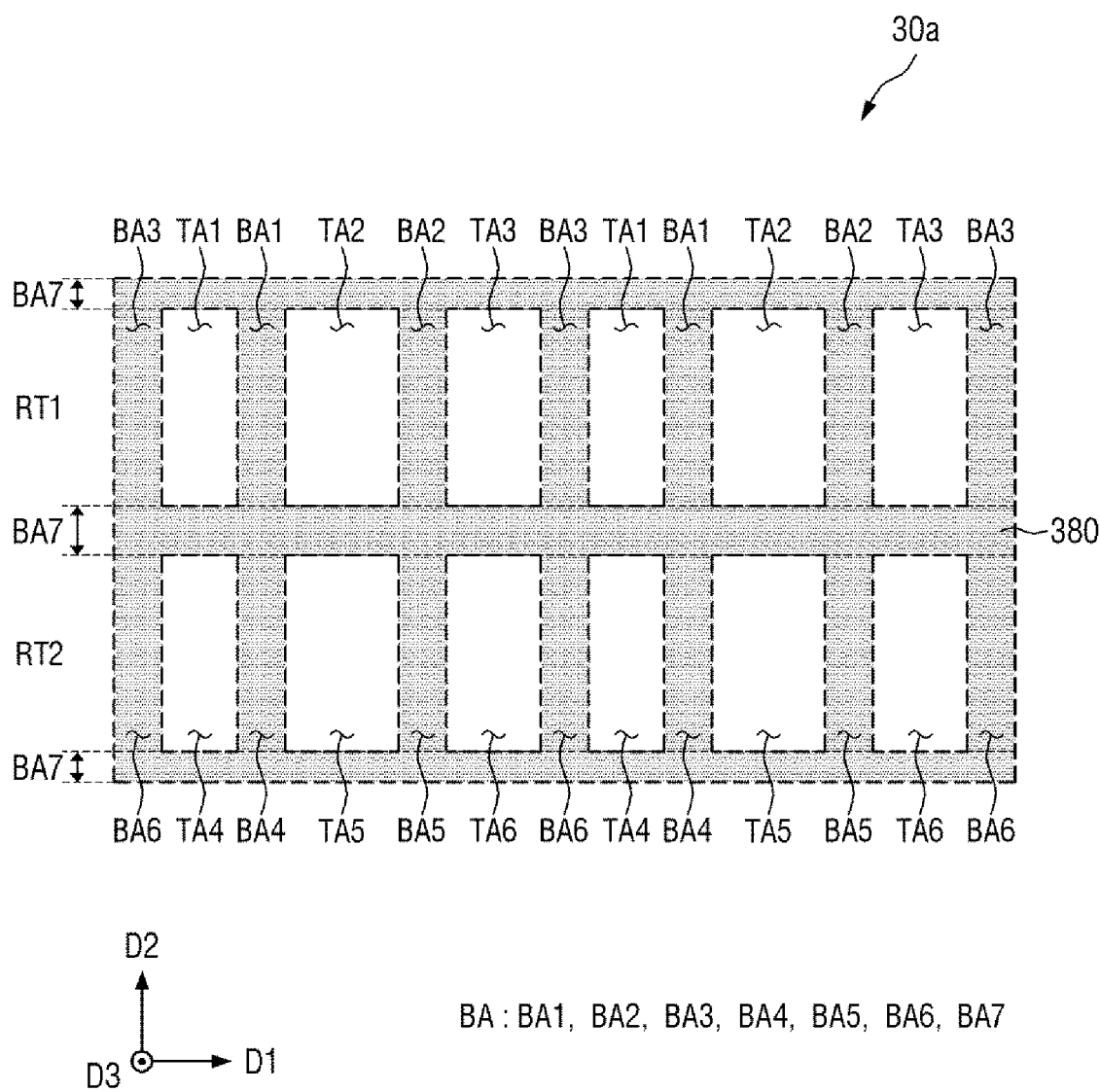
FIG. 17 is a plan view illustrating the arrangement of barrier walls in a color conversion substrate of the display device of FIG. 16.
Figure 18:
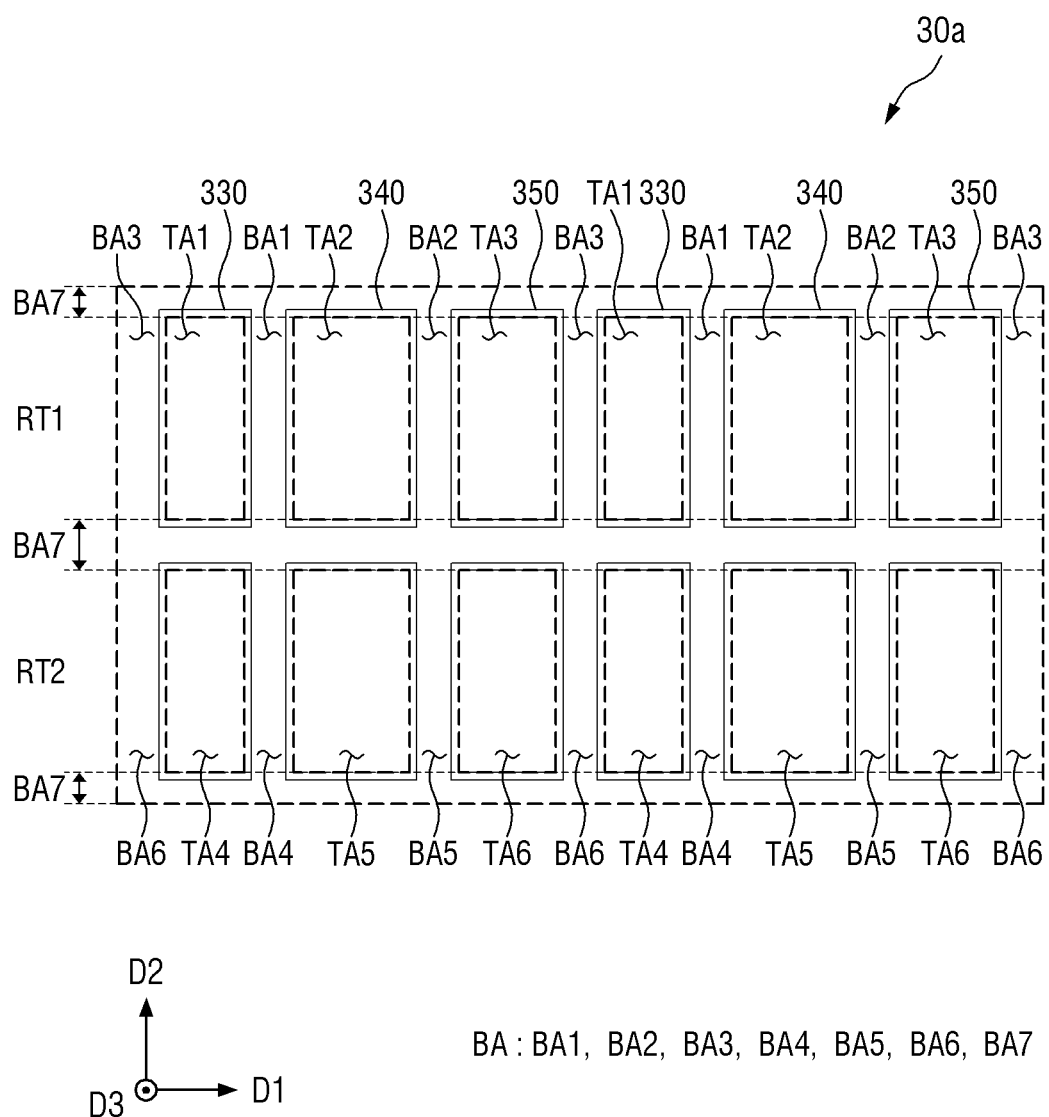
FIG. 18 is a plan view illustrating the arrangement of first wavelength conversion patterns, second wavelength conversion patterns, and light-transmitting patterns in the color conversion substrate of the display device of FIG. 16.

FIG. 16 is a cross-sectional view, taken along the line X1-X1' of FIG. 3 or 4, of a display device according to another embodiment of the present disclosure, FIG. 17 is a plan view illustrating the arrangement of barrier walls in a color conversion substrate of the display device of FIG. 16, and FIG. 18 is a plan view illustrating the arrangement of first wavelength conversion patterns, second wavelength conversion patterns, and light-transmitting patterns in the color conversion substrate of the display device of FIG. 16.

Referring to FIGS. 16 through 18, a display device 1a includes a display substrate 10, a color conversion substrate 30a, and a filler member 70. The display device 1a is substantially the same as, or similar to, the display device 1 of FIGS. 5 and 8 through 11, except that the color conversion substrate 30a includes barrier walls 380, and that the color mixing-preventing members 370 are not provided. The display device 1a will hereinafter be described, focusing mainly on the differences with the display device 1.

The barrier walls 380 may be located in a light-blocking area BA and may overlap with a non-light-emitting area NLA. The barrier walls 380 may be disposed to surround first light-emitting areas LA1, second light-emitting areas LA2, third light-emitting areas LA3, fourth light-emitting areas LA4, fifth light-emitting areas LA5, and sixth light-emitting areas PA6. In some embodiments, the barrier walls 380 may form a lattice shape in a plan view.

In a case where light-transmitting patterns 330, first wavelength conversion patterns 340, and second wavelength conversion patterns 350 are formed by inkjet printing, the barrier walls 380 may serve as a guide for stably (e.g., accurately) positioning an ink composition for forming the light-transmitting patterns 330, the first wavelength conversion patterns 340, and the second wavelength conversion patterns 350 at each desired location.

In some embodiments, the barrier walls 380 may be formed of an organic material, particularly, a photosensitive organic material. The photosensitive organic material may be a negative photosensitive material that is cured when irradiated with light, but the present disclosure is not limited thereto.

In some embodiments, the barrier walls 380 may further include a light-shielding material. That is, the barrier walls 380 may be located in light-blocking areas BA to block the transmission of light. Specifically, the barrier walls 380 may be disposed between the light-transmitting patterns 330 and the first wavelength conversion patterns 340 and between the first wavelength conversion patterns 340 and the second wavelength conversion patterns 350 to prevent or reduce color mixing between adjacent light-transmitting areas.

The light-transmitting patterns 330 may be disposed in first light-transmitting areas TA1 and fourth light-transmitting areas TA4, which are defined by the barrier walls 380.

The first wavelength conversion patterns 340 may be located in second light-transmitting areas TA2 and fifth light-transmitting areas TA5, which are defined by the barrier walls 380.

The second wavelength conversion patterns 350 may be located in third light-transmitting areas TA3 and sixth light-transmitting areas TA6, which are defined by the barrier walls 380.

In some embodiments, the barrier walls 380 may be disposed on a first capping layer 391, and a second capping layer 393 may be disposed on the barrier walls 380, the light-transmitting patterns 330, the first wavelength conversion patterns 340, and the second wavelength conversion patterns 350. In this case, the light-transmitting patterns 330, the first wavelength conversion patterns 340, and the second wavelength conversion patterns 350 may be in direct contact with the barrier walls 380.

Figure 19:
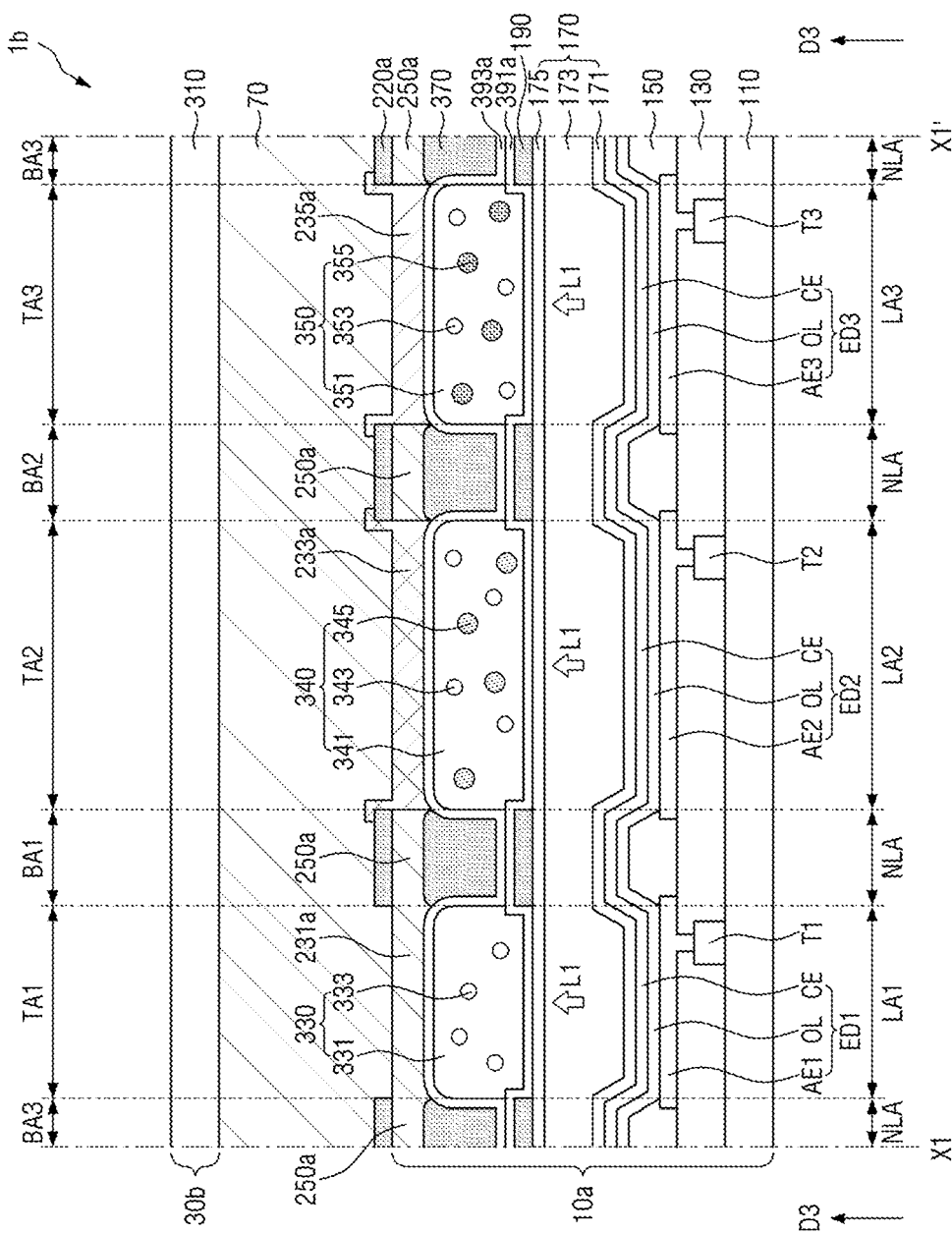
FIG. 19 is a cross-sectional view, taken along the line X1-X1' of FIG. 3 or 4, of a display device according to another embodiment of the present disclosure.

FIG. 19 is a cross-sectional view, taken along the line X1-X1' of FIG. 3 or 4, of a display device according to another embodiment of the present disclosure.

Referring to FIG. 19, a display device 1b is substantially the same as, or similar to, the display device 1 of FIGS. 5 and 8 through 11, except that a display substrate 10a includes all the elements of the color conversion substrate 30 of FIG. 5, except for the second base member 310, and that a color conversion substrate 30b includes only the second base member 310. The display device 1b will hereinafter be described, focusing mainly on the differences with the display device 1.

The display substrate 10a will hereinafter be described.

A panel light-shielding member 190 may be disposed on a thin-film encapsulation layer 170.

A first capping layer 391a which covers the panel light-shielding member 190 may be disposed on the thin-film encapsulation layer 170. In some embodiments, the first capping layer 391a may be in contact with the thin-film encapsulation layer 170 and the panel light-shielding member 190. The first capping layer 391a is substantially the same as the first capping layer 391 of the display device 1 of FIG. 5, and thus, a detailed description thereof will be omitted.

Light-transmitting patterns 330, first wavelength conversion patterns 340, and second wavelength conversion patterns 350 may be disposed on the first capping layer 391a.

The light-transmitting patterns 330 may be located in first light-emitting areas LA1, the first wavelength conversion patterns 340 may be located in second light-emitting areas LA2, and the second wavelength conversion patterns 350 may be located in third light-emitting areas LA3.

In some embodiments, as illustrated in FIG. 15, the light-transmitting patterns 330, the first wavelength conversion patterns 340, and the second wavelength conversion patterns 350 may be formed as stripes.

A second capping layer 393a may be disposed on the light-transmitting patterns 330, the first wavelength conversion patterns 340, and the second wavelength conversion patterns 350. The second capping layer 393a may cover the light-transmitting patterns 330, the first wavelength conversion patterns 340, and the second wavelength conversion patterns 350. The second capping layer 393a is substantially the same as the second capping layer 393 of the display device 1 of FIG. 5, and thus, a detailed description thereof will be omitted.

Color mixing-preventing members 370 may be disposed on the second capping layer 393a. The color mixing-preventing members 370 may be located in a non-light-emitting area NLA and may block the transmission of light. The color mixing-preventing members 370 may be disposed between the light-transmitting patterns 330 and the first wavelength conversion patterns 340 and between the first wavelength conversion patterns 340 and the second wavelength conversion patterns 350 to prevent or reduce color mixing between adjacent light-emitting areas.

First color filters 231a and color patterns 250a may be disposed on the second capping layer 393a and the color mixing-preventing members 370.

The first color filters 231a may be disposed on the second capping layer 393a and may be located in the first light-emitting areas LA1. In some embodiments, the first color filters 231a may be blue color filters and may include a blue colorant such as a blue dye or pigment.

The color patterns 250a may be disposed on the second capping layer 393a and may be located in the non-light-emitting area NLA. The color patterns 250a may overlap with the color mixing-preventing members 370. The color patterns 250a, like (e.g., similar to) the color patterns 250 of FIG. 12, may form a lattice shape. In some embodiments, the color patterns 250a may be in direct contact with the color mixing-preventing members 370. In some embodiments, the color patterns 250a may be formed of the same material as the first color filters 231a and may be connected to the first color filters 231a. In some embodiments, the thickness of the color patterns 250a may be substantially the same as the thickness of the first color filters 231a. The color patterns 250a are substantially the same as the color patterns 250 of the display device 1 of FIG. 5, and thus, a detailed description thereof will be omitted.

Light-shielding members 220a may be disposed on the color patterns 250a. The light-shielding members 220a may be located in the non-light-emitting area NLA and may block the transmission of light. In some embodiments, the light-shielding members 220a, like (e.g., similar to) the light-shielding members 220 of FIG. 13, may be arranged in a lattice structure in a plan view.

In some embodiments, the light-shielding members 220a may include an organic light-shielding material and may be formed by coating the organic light-shielding material and subjecting the organic light-shielding material to exposure (e.g., exposure to light).

Second color filters 233a and third color filters 235a may be disposed on the second capping layer 393a and the color mixing-preventing members 370.

The second color filters 233a may be disposed on the second capping layer 393a and may be located in the second light-emitting areas LA2. In some embodiments, the second color filters 233a may be red color filters and may include a red colorant such as a red dye or pigment. In some embodiments, both ends of each of the second color filters 233a may be located in part in the non-light-emitting area NLA and may overlap with the light-shielding members 220a or the color patterns 250a.

The third color filters 235a may be disposed on the second capping layer 393a and may be located in the third light-emitting areas LA3. In some embodiments, the third color filters 235a may be green color filters and may include a green colorant such as a green dye or pigment. In some embodiments, both ends of each of the third color filters 235a may be located in part in the non-light-emitting area NLA and may overlap with the light-shielding members 220a or the color patterns 250a.

The color conversion substrate 30b, which includes the second base member 310, may be disposed on the display substrate 10a, and a filler member 70 may be disposed between the display substrate 10a and the color conversion substrate 30b.

The color conversion substrate 30b and the filler member 70 may not be provided.

The display device 1b can reduce the alignment tolerance between the elements in each light-emitting area (e.g., the alignment tolerance between a light-emitting element and a wavelength conversion pattern, between a pixel-defining film and a color mixing-preventing member, or between the pixel-defining film and a light-shielding member).

FIG. 20 is a cross-sectional view, taken along the line X1-X1' of FIG. 3 or 4, of a display device according to another embodiment of the present disclosure.

Referring to FIG. 20, a display device 1c is substantially the same as, or similar to, the display device 1b of FIG. 19, except that it does not include the panel light-shielding members 190 and the color mixing-preventing members 370, but includes barrier walls 380. The display device 1c will hereinafter be described, focusing mainly on the differences with the display device 1b.

The barrier walls 380 may be disposed on a thin-film encapsulation layer 170. The barrier walls 380 may be located in a light-blocking area BA and may form a lattice shape in a plan view, as illustrated in FIG. 17.

As already mentioned above with reference to FIGS. 16 through 18, the barrier walls 380 may include a photosensitive material and may further include a light-shielding material.

A first capping layer 391a which covers the barrier walls 380 may be disposed on the thin-film encapsulation layer 170.

Light-transmitting patterns 330, first wavelength conversion patterns 340, and second wavelength conversion patterns 350 may be disposed on the first capping layer 391a.

The light-transmitting patterns 330, the first wavelength conversion patterns 340, and the second wavelength conversion patterns 350 may be formed by inkjet printing, and the barrier walls 380 may serve as a guide for stably (e.g., accurately) positioning an ink composition for forming the light-transmitting patterns 330, the first wavelength conversion patterns 340, and the second wavelength conversion patterns 350 at each desired location.

The light-transmitting patterns 330 may be located in first light-emitting areas LA1 which are defined by the barrier walls 380.

The first wavelength conversion patterns 340 may be located in second light-emitting areas LA2 which are defined by the barrier walls 380.

The second wavelength conversion patterns 350 may be located in third light-emitting areas LA3 which are defined by the barrier walls 380.

A second capping layer 393a may be disposed on the light-transmitting patterns 330, the first wavelength conversion patterns 340, and the second wavelength conversion patterns 350.

First color filters 231a and color patterns 250a may be disposed on the second capping layer 393a.

The first color filters 231a may be disposed on the second capping layer 393a and may be located in the first light-emitting areas LA1. The color patterns 250a may be disposed on the second capping layer 393a and may be located in a non-light-emitting area NLA.

Light-shielding members 220a may be disposed on the color patterns 250a. The light-shielding members 220a may be located in the non-light-emitting area NLA and may block the transmission of light.

Second color filters 233a and third color filters 235a may be disposed on the second capping layer 393a. The second color filters 233a may be disposed on the second capping layer 393a and may be located in the second light-emitting areas LA2 to overlap with the first wavelength conversion patterns 340. The third color filters 235a may be disposed on the second capping layer 393a and may be located in the third light-emitting areas LA3 to overlap with the second wavelength conversion patterns 350.

A color conversion substrate 30b which includes a second base member 310 may be disposed on a display substrate 10b, and a filler member 70 may be disposed between the display substrate 10b and the color conversion substrate 30b.

The color conversion substrate 30b and the filler member 70 may not be provided.

According to the above-described embodiments, the distortion of colors by the reflection of external light can be reduced, and the display quality of a display device can be improved.

Also, any differences in the amount of light between different colors that may be caused by differences in light conversion efficiency between wavelength conversion patterns can be compensated for with light emitted from OLEDs. Accordingly, any differences in the amount of emitted light between different colors can be reduced, and as a result, the color reproducibility and display quality of a display device can be improved.

Also, because the peak wavelength range of light emitted from each light-emitting element can be widened, the side viewing angles of a display device can be improved.

The effects of the present invention are not limited by the foregoing, and other various effects are anticipated herein.

Although the preferred embodiments of the present invention have been disclosed for illustrative purposes, those skilled in the art will appreciate that various modifications, additions and substitutions are possible, without departing from the scope and spirit of the invention as disclosed in the accompanying claims, and equivalents thereof.

What is claimed is:

1. A display device comprising:
a first base member including a first area, a second area, and a third area between the first area and the second area;
a first anode electrode on the first base member and located in the first area;
a second anode electrode on the first base member and located in the second area;
light-emitting layers on the first anode electrode and the second anode electrode;
a cathode electrode on the light-emitting layers;
a second base member on the cathode electrode, the second base member including a first surface facing the first base member;
a first color filter on the first surface of the second base member and overlapping with the first area;
a second color filter on the first surface of the second base member and overlapping with the second area;
a color pattern on the first surface of the second base member, the color pattern being between the first color filter and the second color filter, the color pattern overlapping with the third area; and
a first wavelength conversion pattern on the second color filter and comprising a first wavelength shifter, wherein
the light-emitting layers comprise a first light-emitting layer, a second light-emitting layer overlapping the first light-emitting layer, and a third light-emitting layer overlapping the first light-emitting layer and the second light-emitting layer,
the first light-emitting layer, the second light-emitting layer, and the third light-emitting layer are to emit light having a peak wavelength of about 440 nm to about 610 nm,
one selected from the first light-emitting layer, the second light-emitting layer, and the third light-emitting layer is to emit light of a first peak wavelength, and
another one selected from the first light-emitting layer, the second light-emitting layer, and the third light-emitting layer is to emit light of a second peak wavelength different from the first peak wavelength.

2. The display device of claim 1, wherein
the first peak wavelength ranges from 440 nm to 480 nm, and
the second peak wavelength ranges from 510 nm to 550 nm.

3. The display device of claim 1, wherein
the first peak wavelength ranges from 440 nm to 480 nm, and
the second peak wavelength ranges from 460 nm to 480 nm.

4. The display device of claim 1, wherein
the light-emitting layers further comprise a fourth light-emitting layer overlapping the first light-emitting layer, the second light-emitting layer, and the third light-emitting layer, and
the fourth light-emitting layer is to emit light having a peak wavelength of 440 nm to 610 nm.

5. The display device of claim 4, wherein
one selected from the first light-emitting layer, the second light-emitting layer, the third light-emitting layer and the fourth light-emitting layer is to emit green light, and
other three selected from the first light-emitting layer, the second light-emitting layer, the third light-emitting layer and the fourth light-emitting layer are to emit blue light.

6. The display device of claim 1, wherein
the first color filter and the color pattern comprise a blue colorant, and
the second color filter comprises another colorant different from the blue colorant.

7. The display device of claim 6, wherein a thickness of the first color filter is substantially the same as a thickness of the color pattern.

8. The display device of claim 1, further comprising:
a light-transmitting pattern on the first color filter,
wherein the light-transmitting pattern comprises a base resin and a scatterer in the base resin.

9. The display device of claim 8, further comprising:
a first capping layer on the first surface of the second base member and covering the first color filter, the second color filter, and the color pattern,
wherein
the first capping layer comprises an inorganic material, and
the light-transmitting pattern and the first wavelength conversion pattern are on the first capping layer.

10. The display device of claim 9, wherein the first capping layer is in direct contact with the light-transmitting pattern and the first wavelength conversion pattern.

11. The display device of claim 9, further comprising:
a barrier wall between the light-transmitting pattern and the first wavelength conversion pattern; and a second capping layer on the first capping layer and covering the light-transmitting pattern, the first wavelength conversion pattern, and the barrier wall, wherein the barrier wall comprises a light-shielding material.

12. The display device of claim 11, wherein the light-transmitting pattern and the first wavelength conversion pattern are in direct contact with the barrier wall.

13. The display device of claim 1, further comprising:
an inorganic layer on the cathode electrode;
a capping layer on the first wavelength conversion pattern; and
a filler member between the inorganic layer and the capping layer,
wherein the capping layer is in direct contact with the filler member.

14. The display device of claim 1, further comprising:
a third anode electrode on the first base member and located in a fourth area, wherein the fourth area is further defined on the first base member;
a third color filter on the first surface of the second base member and overlapping with the fourth area; and
a second wavelength conversion pattern on the third color filter and comprising a second wavelength shifter,
wherein
the light-emitting layers are further located on the third anode electrode, and
the third color filter comprises a different colorant from the first color filter and the second color filter.

15. The display device of claim 14, wherein
the color pattern is on the second base member and is further between the second color filter and the third color filter.

16. The display device of claim 15, wherein
the first color filter and the color pattern comprise a blue colorant,
one selected from the second and third color filters comprises a red colorant, and
another one selected from the second and third color filters comprises a green colorant.

17. The display device of claim 14, wherein the first wavelength shifter and the second wavelength shifter comprise quantum dots.

18. A display device comprising:
a first base member including a first area, a second area, and a third area between the first area and the second area;
a first anode electrode on the first base member and located in the first area;
a second anode electrode on the first base member and located in the second area;
light-emitting layers on the first anode electrode and the second anode electrode;
a cathode electrode on the light-emitting layers;
a second base member on the cathode electrode, the second base member including a first surface facing the first base member;
a first color filter on the first surface of the second base member and overlapping with the first area;
a second color filter on the first surface of the second base member and overlapping with the second area;
a color pattern on the first surface of the second base member, the color pattern being between the first color filter and the second color filter, the color pattern overlapping with the third area; and a first wavelength conversion pattern on the second color filter and comprising a first wavelength shifter,
wherein
the light-emitting layers comprise a first light-emitting layer, a second light-emitting layer overlapping the first light-emitting layer, and a third light-emitting layer overlapping the first light-emitting layer and the second light-emitting layer,
the first light-emitting layer, the second light-emitting layer, and the third light-emitting layer are to emit light having a peak wavelength of about 440 nm to about 610 nm,
one selected from the first light-emitting layer, the second light-emitting layer, and the third light-emitting layer is to emit light of a first peak wavelength, and
another one selected from the first light-emitting layer, the second light-emitting layer, and the third light-emitting layer is to emit light of a second peak wavelength different from the first peak wavelength,
wherein a portion of the second color filter overlaps the color pattern, and
wherein the second color filter comprises a colorant different from a colorant included in the color pattern.

19. A display device comprising:
a base member including a first area, a second area, and a third area between the first area and the second area;
a first anode electrode on the base member and overlapping with the first area;
a second anode electrode on the base member and overlapping with the second area;
light-emitting layers on the first anode electrode and the second anode electrode;
a cathode electrode on the light-emitting layers;
an inorganic layer on the cathode electrode;
a first color filter on the inorganic layer and overlapping with the first area;
a second color filter on the inorganic layer and overlapping with the second area;
a color pattern on the inorganic layer, the color pattern being between the first color filter and the second color filter, and overlapping with the third area;
a light-transmitting pattern between the first color filter and the inorganic layer; and
a wavelength conversion pattern between the second color filter and the inorganic layer and comprising a wavelength shifter,
wherein
the light-emitting layers comprise a first light-emitting layer, a second light-emitting layer overlapping the first light-emitting layer, and a third light-emitting layer overlapping the first light-emitting layer and the second light-emitting layer,
the first light-emitting layer, the second light-emitting layer, and the third light-emitting layer are to emit light having a peak wavelength of about 440 nm to about 610 nm,
one selected from the first light-emitting layer, the second light-emitting layer, and the third light-emitting layer is to emit light of a first peak wavelength, and
another one selected from the first light-emitting layer, the second light-emitting layer, and the third light-emitting layer is to emit light of a second peak wavelength different from the first peak wavelength.

20. The display device of claim 19, wherein the first color filter and the color pattern comprise a same colorant.

21. The display device of claim 19, wherein a portion of the second color filter overlaps the color pattern.

22. The display device of claim 19, wherein
the light-emitting layers further comprise a fourth light-emitting layer overlapping the first light-emitting layer, the second light-emitting layer, and the third light-emitting layer, and
the fourth light-emitting layer is to emit light having a peak wavelength of 440 nm to 610 nm.

23. The display device of claim 22, wherein
one selected from the first light-emitting layer, the second light-emitting layer, the third light-emitting layer and the fourth light-emitting layer is to emit green light, and
other three selected from the first light-emitting layer, the second light-emitting layer, the third light-emitting layer and the fourth light-emitting layer are to emit blue light.

24. The display device of claim 19, further comprising:
a barrier wall on the inorganic layer, the barrier wall being between the light-transmitting pattern and the wavelength conversion pattern; and
a capping layer covering the light-transmitting pattern, the wavelength conversion pattern, and the barrier wall,
wherein the first color filter and the second color filter are on the capping layer.

25. The display device of claim 24, wherein the barrier wall comprises a light-shielding material.

* * * * *